United States Patent [19]
Eldridge et al.

[11] Patent Number: 5,983,493
[45] Date of Patent: Nov. 16, 1999

[54] METHOD OF TEMPORARILY, THEN PERMANENTLY, CONNECTING TO A SEMICONDUCTOR DEVICE

[75] Inventors: Benjamin N. Eldridge, Danville; Gary W. Grube, Pleasanton; Igor Y. Khandros, Orinda; Gaetan L. Mathieu, Dublin, all of Calif.

[73] Assignee: FormFactor, Inc., Livermore, Calif.

[21] Appl. No.: 08/839,763

[22] Filed: Apr. 15, 1997

Related U.S. Application Data

[62] Division of application No. 08/558,332, Nov. 15, 1995, Pat. No. 5,829,128, and a continuation-in-part of application No. 08/526,246, Sep. 21, 1995, abandoned, application No. 08/553,584, Oct. 18, 1995, Pat. No. 5,772,451, and application No. 08/554,902, Nov. 9, 1995, said application No. 08/558,332, is a continuation-in-part of application No. 08/452,255, May 26, 1995, which is a continuation-in-part of application No. 08/340,144, filed as application No. PCT/US94/13373, Nov. 16, 1994, Pat. No. 5,917,707, which is a continuation-in-part of application No. 08/152,812, Nov. 16, 1993, Pat. No. 5,476,211.

[51] Int. Cl.⁶ ................................................. H01R 43/00
[52] U.S. Cl. ................................ 29/855; 29/840; 29/843; 228/179; 228/180.21
[58] Field of Search ........................ 29/830, 852, 855, 29/840, 843; 228/179, 180.21

[56] References Cited

U.S. PATENT DOCUMENTS

| | | |
|---|---|---|
| 4,764,848 | 8/1988 | Simpson . |
| 4,955,523 | 9/1990 | Carlomagno et al. . |
| 5,189,507 | 2/1993 | Carlomagno et al. . |
| 5,476,211 | 12/1995 | Khandros . |
| 5,585,282 | 12/1996 | Wood et al. . |
| 5,665,654 | 9/1997 | Stansbury . |

*Primary Examiner*—Carl J. Arbes
*Attorney, Agent, or Firm*—Gerald Linden; David Larwood

[57] ABSTRACT

Resilient contact structures are mounted directly to bond pads on semiconductor dies, prior to the dies being singulated (separated) from a semiconductor wafer. This enables the semiconductor dies to be exercised (e.g., tested and/or burned-in) by connecting to the semiconductor dies with a circuit board or the like having a plurality of terminals disposed on a surface thereof. Subsequently, the semiconductor dies may be singulated from the semiconductor wafer, whereupon the same resilient contact structures can be used to effect interconnections between the semiconductor dies and other electronic components (such as wiring substrates, semiconductor packages, etc.). Using the all-metallic composite interconnection elements of the present invention as the resilient contact structures, burn-in can be performed at temperatures of at least 150° C., and can be completed in less than 60 minutes.

15 Claims, 15 Drawing Sheets

(PRIOR ART)  740

- WAFER FAB — 742
- WAFER PROBE/MAP — 744
- WAFER SAW — 746
- DIE ATTACH — 748
- WIRE BOND — 750
- OVERMOLD — 752
- SOLDER PLATE — 754
- TRIM & FORM — 756
- TRAY PACK — 758
- BURN-IN — 760
- SPEED SORT — 762
- SMT CARD ASSEMBLY — 764

- WAFER FAB — 782
- WAFER PROBE/MAP — 784
- SPUTTER/ RESIST/ PAD PLATE — 786
- SPRING ATTACH — 788
- SPRING DEPOSIT/ STRIP — 790
- HOT CHUCK BURN-IN — 792
- SPEED SORT — 794
- WAFER SAW — 796
- SMT CARD ASSEMBLY — 798

5,983,493

METHOD OF TEMPORARILY, THEN PERMANENTLY, CONNECTING TO A SEMICONDUCTOR DEVICE

CROSS-REFERENCE TO RELATED APPLICATIONS

This patent application is a division of commonly-owned U.S. patent application Ser. No. 08/558,332 filed Nov. 15, 1995 (U.S. Pat. No. 5,829,128, issued Nov. 3, 1998) a continuation-in-part of commonly-owned, copending U.S. patent application Ser. No. 08/452,255 (hereinafter "PARENT CASE"), filed May 26, 1995, pending, which is a continuation-in-part of commonly-owned, U.S. patent application Ser. No. 08/340,144 filed Nov. 15, 1994, U.S. Pat. No. 5,917,707, and its counterpart PCT patent application number PCT/US94/13373 filed Nov. 16, 1994 (published May 26, 1995 as WO 95/14314), both of which are continuations-in-part of commonly-owned, U.S. patent application Ser. No. 08/152,812, filed Nov. 16, 1993 (U.S. Pat. No. 5,476,211, issued Dec. 19, 1995).

This patent application is also a continuation-in-part of commonly-owned, U.S. patent application Ser. No. 08/526,246, filed Sep. 21, 1995, abandoned, and of commonly-owned, U.S. patent application Ser. No. 08/533,584, filed Oct. 18, 1995 (U.S. Pat. No. 5,772,451, issued Jun. 30, 1998), and of commonly-owned, copending U.S. patent application Ser. No. 08./554,902, filed Nov. 9, 1995, pending.

TECHNICAL FIELD OF THE INVENTION

The invention relates to making temporary, pressure connections between electronic components and, more particularly, to techniques for "exercising" (performing test and burn-in procedures upon) semiconductor devices prior to their packaging, preferably prior to the individual semiconductor devices being singulated (separated) from a semiconductor wafer.

BACKGROUND OF THE INVENTION

Individual semiconductor (integrated circuit) devices (dies) are typically produced by creating several identical devices on a semiconductor wafer, using known techniques of photolithography, deposition, and the like. Generally, these processes are intended to create a plurality of fully-functional integrated circuit devices, prior to singulating (severing) the individual dies from the semiconductor wafer. In practice, however, certain physical defects in the wafer itself and certain defects in the processing of the wafer inevitably lead to some of the dies being "good" (fully-functional) and some of the dies being "bad" (non-functional). It is generally desirable to be able to identify which of the plurality of dies on a wafer are good dies prior to their packaging, and preferably prior to their being singulated from the wafer. To this end, a wafer "tester" or "prober" may advantageously be employed to make a plurality of discrete pressure connections to a like plurality of discrete connection pads (bond pads) on the dies, and provide signals (including power) to the dies. In this manner, the semiconductor dies can be exercised (tested and burned in), prior to singulating the dies from the wafer. A conventional component of a wafer tester is a "probe card" to which a plurality of probe elements are connected-tips of the probe elements effecting the pressure connections to the respective bond pads of the semiconductor dies.

Certain difficulties are inherent in any technique for probing semiconductor dies. For example, modern integrated circuits include many thousands of transistor elements requiring many hundreds of bond pads disposed in close proximity to one another (e.g., 5 mils center-to-center). Moreover, the layout of the bond pads need not be limited to single rows of bond pads disposed close to the peripheral edges of the die (See, e.g., U.S. Pat. No. 5,453,583).

To effect reliable pressure connections between the probe elements and the semiconductor die one must be concerned with several parameters including, but not limited to: alignment, probe force, overdrive, contact force, balanced contact force, scrub, contact resistance, and planarization. A general discussion of these parameters may be found in U.S. Pat. No. 4,837,622, entitled HIGH DENSITY PROBE CARD, incorporated by reference herein, which discloses a high density epoxy ring probe card including a unitary printed circuit board having a central opening adapted to receive a preformed epoxy ring array of probe elements.

Generally, prior art probe card assemblies include a plurality of tungsten needles extending as cantilevers from a surface of a probe card. The tungsten needles may be mounted in any suitable manner to the probe card, such as by the intermediary of an epoxy ring, as discussed hereinabove. Generally, in any case, the needles are wired to terminals of the probe card through the intermediary of a separate and distinct wire connecting the needles to the terminals of the probe card.

Probe cards are typically formed as circular rings, with hundreds of probe elements (needles) extending from an inner periphery of the ring (and wired to terminals of the probe card). Circuit modules, and conductive traces (lines) of preferably equal length, are associated with each of the probe elements. This ring-shape layout makes it difficult, and in some cases impossible, to probe a plurality of unsingulated semiconductor dies (multiple sites) on a wafer, especially when the bond pads of each semiconductor die are arranged in other than two linear arrays along two opposite edges of the semiconductor die.

Wafer testers may alternately employ a probe membrane having a central contact bump area, as is discussed in U.S. Pat. No. 5,422,574, entitled LARGE SCALE PROTRUSION MEMBRANE FOR SEMICONDUCTOR DEVICES UNDER TEST WITH VERY HIGH PIN COUNTS, incorporated by reference herein. As noted in this patent, "A test system typically comprises a test controller for executing and controlling a series of test programs, a wafer dispensing system for mechanically handling and positioning wafers in preparation for testing and a probe card for maintaining an accurate mechanical contact with the device-under-test (DUT)." (column 1, lines 41–46).

Additional references, incorporated by reference herein, as indicative of the state of the art in testing semiconductor devices, include U.S. Pat. No. 5,442,282 (TESTING AND EXERCISING INDIVIDUAL UNSINGULATED DIES ON A WAFER); U.S. Pat. No. 5,382,898 (HIGH DENSITY PROBE CARD FOR TESTING ELECTRICAL CIRCUITS); U.S. Pat. No. 5,378,982 TEST PROBE FOR PANEL HAVING AN OVERLYING PROTECTIVE MEMBER ADJACENT PANEL CONTACTS); U.S. Pat. No. 5,339,027 (RIGID-FLEX CIRCUITS WITH RAISED FEATURES AS IC TEST PROBES); U.S. Pat. No. 5,180,977 (MEMBRANE PROBE CONTACT BUMP COMPLIANCY SYSTEM); U.S. Pat. No. 5,066,907 (PROBE SYSTEM FOR DEVICE AND CIRCUIT TESTING); U.S. Pat. No. 4,757,256 (HIGH DENSITY PROBE CARD); U.S. Pat. No. 4,161,692 (PROBE DEVICE FOR INTEGRATED CIRCUIT WAFERS); and U.S. Pat. No. 3,990,689

(ADJUSTABLE HOLDER ASSEMBLY FOR POSITIONING A VACUUM CHUCK).

Generally, interconnections between electronic components can be classified into the two broad categories of "relatively permanent" and "readily demountable".

An example of a "relatively permanent" connection is a solder joint. Once two components are soldered to one another, a process of unsoldering must be used to separate the components. A wire bond is another example of a "relatively permanent" connection.

An example of a "readily demountable" connection is rigid pins of one electronic component being received by resilient socket elements of another electronic component. The socket elements exert a contact force (pressure) on the pins in an amount sufficient to ensure a reliable electrical connection therebetween.

Interconnection elements intended to make pressure contact with terminals of an electronic component are referred to herein as "springs" or "spring elements". Generally, a certain minimum contact force is desired to effect reliable pressure contact to electronic components (e.g., to terminals on electronic components). For example, a contact (load) force of approximately 15 grams (including as little as 2 grams or less and as much as 150 grams or more, per contact) may be desired to ensure that a reliable electrical connection is made to a terminal of an electronic component which may be contaminated with films on its surface, or which has corrosion or oxidation products on its surface. The minimum contact force required of each spring demands either that the yield strength of the spring material or that the size of the spring element are increased. As a general proposition, the higher the yield strength of a material, the more difficult it will be to work with (e.g., punch, bend, etc.). And the desire to make springs smaller essentially rules out making them larger in cross-section.

Probe elements are a class of spring elements of particular relevance to the present invention. Prior art probe elements are commonly fabricated from titanium, a relatively hard (high yield strength) material. When it is desired to mount such relatively hard materials to terminals of an electronic component, relatively "hostile" (e.g., high temperature) processes such as brazing are required. Such "hostile" processes are generally not desirable (and often not feasible) in the context of certain relatively "fragile" electronic components such as semiconductor devices. In contrast thereto, wire bonding is an example of a relatively "friendly" processes which is much less potentially damaging to fragile electronic components than brazing. Soldering is another example of a relatively "friendly" process. However, both solder and gold are relatively soft (low yield strength) materials which will not function well as spring elements.

A subtle problem associated with interconnection elements, including spring contacts, is that, often, the terminals of an electronic component are not perfectly coplanar. Interconnection elements lacking in some mechanism incorporated therewith for accommodating these "tolerances" (gross non-planarities) will be hard pressed to make consistent contact pressure contact with the terminals of the electronic component.

The following U.S. Patents, incorporated by reference herein, are cited as being of general interest vis-a-vis making connections, particularly pressure connections, to electronic components: U.S. Pat. No. 5,386,344 (FLEX CIRCUIT CARD ELASTOMERIC CABLE CONNECTOR ASSEMBLY); U.S. Pat. No. 5,336,380 (SPRING BIASED TAPERED CONTACT ELEMENTS FOR ELECTRICAL CONNECTORS AND INTEGRATED CIRCUIT PACKAGES); U.S. Pat. No. 5,317,479 (PLATED COMPLIANT LEAD); U.S. Pat. No. 5,086,337 (CONNECTING STRUCTURE OF ELECTRONIC PART AND ELECTRONIC DEVICE USING THE STRUCTURE); U.S. Pat. No. 5,067,007 (SEMICONDUCTOR DEVICE HAVING LEADS FOR MOUNTING TO A SURFACE OF A PRINTED CIRCUIT BOARD); U.S. Pat. No. 4,989,069 (SEMICONDUCTOR PACKAGE HAVING LEADS THAT BREAK-AWAY FROM SUPPORTS); U.S. Pat. No. 4,893,172 (CONNECTING STRUCTURE FOR ELECTRONIC PART AND METHOD OF MANUFACTURING THE SAME); U.S. Pat. No. 4,793,814 (ELECTRICAL CIRCUIT BOARD INTERCONNECT); U.S. Pat. No. 4,777,564 (LEADFORM FOR USE WITH SURFACE MOUNTED COMPONENTS); U.S. Pat. No. 4,764,848 (SURFACE MOUNTED ARRAY STRAIN RELIEF DEVICE); U.S. Pat. No. 4,667,219 (SEMICONDUCTOR CHIP INTERFACE); U.S. Pat. No. 4,642,889 (COMPLIANT INTERCONNECTION AND METHOD THEREFOR); U.S. Pat. No. 4,330,165 (PRESS-CONTACT TYPE INTERCONNECTORS); U.S. Pat. No. 4,295,700 (INTERCONNECTORS); U.S. Pat. No. 4,067,104 (METHOD OF FABRICATING AN ARRAY OF FLEXIBLE METALLIC INTERCONNECTS FOR COUPLING MICROELECTRONICS COMPONENTS); U.S. Pat. No. 3,795,037 (ELECTRICAL CONNECTOR DEVICES); U.S. Pat. No. 3,616,532 (MULTILAYER PRINTED CIRCUIT ELECTRICAL INTERCONNECTION DEVICE); and U.S. Pat. No. 3,509,270 (INTERCONNECTION FOR PRINTED CIRCUITS AND METHOD OF MAKING SAME).

Generally, throughout the probe techniques described hereinabove, a probe card or the like having a plurality of resilient contact structures extending from or upon a surface thereof is urged against a semiconductor wafer to make pressure contacts with a corresponding plurality of terminals (bond pads) on an individual semiconductor die. In some cases, pressure contact with a limited number (e.g., four) of unsingulated dies arranged end-to-end can be made, depending upon the layout of the bond pads on the semiconductor dies (e.g., a linear array of bond pads on each of the two side edges of the dies). (The end-to-end dies can be treated as one long die having two rows of bond pads.)

A limited number of techniques are suggested in the prior art for providing semiconductor chip assemblies with terminals that are biased away from the surface of the semiconductor die (chip). U.S. Pat. No. 5,414,298, entitled SEMICONDUCTOR CHIP ASSEMBLIES AND COMPONENTS WITH PRESSURE CONTACT, discloses that such an assembly "can be extremely compact and may occupy an area only slightly larger than the area of the chip itself."

One might be tempted to surmise that it is a simple intuitive step to expand such techniques to wafer-level. To the contrary, it is not at all apparent how such "assemblies" which are larger than the die could be accommodated at wafer-level, without requiring there to be a greatly expanded kerf (scribing) area disposed between each adjacent die. Additionally, it is not at all apparent how such "assemblies" would be fabricated upon a plurality of unsingulated dies. Moreover, such assemblies are generally constrained to "translating" peripheral arrays (i.e., a peripheral (edge) layout of bond pads on a semiconductor die) to area arrays (e.g., rows and columns) of terminals, and require a good deal of valuable "real estate" to effect the translation. Routing the connections is one serious limitation, and typically the connections "fan-in". The use of non-metallic materials (i.e., materials incapable of sustaining high temperatures) is another concern.

Another serious concern with any technique such as is described in the aforementioned U.S. Pat. No. 5,414,298 is that the face of the die is covered. This is generally undesirable, and is particularly undesirable in the context of gallium arsenide (GaAs) semiconductor devices.

BRIEF DESCRIPTION (SUMMARY) OF THE INVENTION

It is an object of the present invention to provide a technique for testing (exercising and/or burning-in) semiconductor dies, prior to their being singulated (separated) from a semiconductor wafer.

It is another object of the present invention to provide a technique for probing semiconductor dies, prior to their being singulated (separated) from a semiconductor wafer, without being constrained by the arrangement of dies or the layout of bond pads on the dies.

It is another object of the present invention to provide a technique for probing semiconductor dies, prior to their being singulated (separated) from a semiconductor wafer, with the requisite resiliency and/or compliance being resident on the semiconductor dies, rather than requiring the probe cards to be provided with resilient contact structures extending therefrom.

It is another object of the invention to mount resilient contact structures directly to semiconductor devices, thereby permitting exercising (testing and burning-in) the devices via the resilient contact structures, and using the same resilient contact structures for final packaging of the semiconductor devices.

It is another object of the present invention to provide a technique for satisfactorily burning-in semiconductor devices in several minutes (versus several hours).

It is another object of the present invention to provide an improved spring element (resilient contact structure) that can be mounted directly to a terminal of an electronic component.

It is another object of the invention to provide interconnection elements that are suitable for making pressure contact to electronic components.

According to the invention, spring contact elements (composite interconnection elements) are mounted directly to semiconductor dies. Preferably, the spring contact elements are mounted to the semiconductor dies prior to the semiconductor dies being singulated (separated) from a semiconductor wafer. In this manner, a plurality of pressure contacts can be made to one or more unsingulated semiconductor dies (devices) using a "simple" test board to power-up the semiconductor devices, and the like.

As used herein, a "simple" test board is a substrate having a plurality of terminals, or electrodes, as contrasted with a traditional "probe card" which is a substrate having a plurality of probe elements extending from a surface thereof. A simple test board is less expensive, and more readily configured than a traditional probe card. Moreover, certain physical constraints inherent in traditional probe cards are not encountered when using a simple test board to make the desired pressure contacts with semiconductor devices.

In this manner, a plurality of unsingulated semiconductor dies can be exercised (tested and/or burned in) prior to the semiconductor dies being singulated (separated) from the wafer.

According to an aspect of the invention, the same spring contact elements which are mounted to the semiconductor dies and which are used to exercise the semiconductor dies can be used to make permanent connections to the semiconductor dies after they have been singulated from the wafer.

According to an aspect of the invention, the resilient contact structures are preferably formed as "composite interconnection elements" which are fabricated directly upon the terminals of the semiconductor device. The "composite" (multilayer) interconnection element is fabricated by mounting an elongate element ("core") to an electronic component, shaping the core to have a spring shape, and overcoating the core to enhance the physical (e.g., spring) characteristics of the resulting composite interconnection element and/or to securely anchor the resulting composite interconnection element to the electronic component. The resilient contact structures of the interposer component may also be formed as composite interconnection elements.

The use of the term "composite", throughout the description set forth herein, is consistent with a 'generic' meaning of the term (e.g., formed of two or more elements), and is not to be confused with any usage of the term "composite" in other fields of endeavor, for example, as it may be applied to materials such as glass, carbon or other fibers supported in a matrix of resin or the like.

As used herein, the term "spring shape" refers to virtually any shape of an elongate element which will exhibit elastic (restorative) movement of an end (tip) of the elongate element with respect to a force applied to the tip. This includes elongate elements shaped to have one or more bends, as well as substantially straight elongate elements.

As used herein, the terms "contact area", "terminal", "pad", and the like refer to any conductive area on any electronic component to which an interconnection element is mounted or makes contact.

Alternatively, the core is shaped prior to mounting to an electronic component.

Alternatively, the core is mounted to or is a part of a sacrificial substrate which is not an electronic component. The sacrificial substrate is removed after shaping, and either before or after overcoating. According to an aspect of the invention, tips having various topographies can be disposed at the contact ends of the interconnection elements. (See also FIGS. 11A–11F of the PARENT CASE.)

In an embodiment of the invention, the core is a "soft" material having a relatively low yield strength, and is overcoated with a "hard" material having a relatively high yield strength. For example, a soft material such as a gold wire is attached (e.g., by wire bonding) to a bond pad of a semiconductor device and is overcoated (e.g., by electrochemical plating) with a hard material such nickel and its alloys.

Vis-a-vis overcoating the core, single and multi-layer overcoatings, "rough" overcoatings having microprotrusions (see also FIGS. 5C and 5D of the PARENT CASE), and overcoatings extending the entire length of or only a portion of the length of the core, are described. In the latter case, the tip of the core may suitably be exposed for making contact to an electronic component (see also FIG. 5B of the PARENT CASE).

Generally, throughout the description set forth herein, the term "plating" is used as exemplary of a number of techniques for overcoating the core. It is within the scope of this invention that the core can be overcoated by any suitable technique including, but not limited to: various processes involving deposition of materials out of aqueous solutions; electrolytic plating; electroless plating; chemical vapor deposition (CVD); physical vapor deposition (PVD); processes causing the deposition of materials through induced disintegration of liquid or solid precursors; and the like, all of these techniques for depositing materials being generally well known.

Generally, for overcoating the core with a metallic material such as nickel, electrochemical processes are preferred, especially electroless plating.

In another embodiment of the invention, the core is an elongate element of a "hard" material, inherently suitable to functioning as a spring element, and is mounted at one end to a terminal of an electronic component. The core, and at least an adjacent area of the terminal, is overcoated with a material which will enhance anchoring the core to the terminal. In this manner, it is not necessary that the core be well-mounted to the terminal prior to overcoating, and processes which are less potentially damaging to the electronic component may be employed to "tack" the core in place for subsequent overcoating. These "friendly" processes include soldering, gluing, and piercing an end of the hard core into a soft portion of the terminal.

Preferably, the core is in the form of a wire. Alternatively, the core is a flat tab (conductive metallic ribbon).

Representative materials, both for the core and for the overcoatings, are disclosed.

In the main hereinafter, techniques involving beginning with a relatively soft (low yield strength) core, which is generally of very small dimension (e.g., 3.0 mil or less) are described. Soft materials, such as gold, which attach easily to semiconductor devices, generally lack sufficient resiliency to function as springs. (Such soft, metallic materials exhibit primarily plastic, rather than elastic deformation.) Other soft materials which may attach easily to semiconductor devices and possess appropriate resiliency are often electrically nonconductive, as in the case of most elastomeric materials. In either case, desired structural and electrical characteristics can be imparted to the resulting composite interconnection element by the overcoating applied over the core. The resulting composite interconnection element can be made very small, yet can exhibit appropriate contact forces. Moreover, a plurality of such composite interconnection elements can be arranged at a fine pitch (e.g., 10 mils), even though they have a length (e.g., 100 mils) which is much greater than the distance to a neighboring composite interconnection element (the distance between neighboring interconnection elements being termed "pitch").

It is within the scope of this invention that composite interconnection elements can be fabricated on a microminiature scale, for example as "microsprings" for connectors and sockets, having cross-sectional dimensions on the order of twenty-five microns ($\mu$m), or less. This ability to manufacture reliable interconnection having dimensions measured in microns, rather than mils, squarely addresses the evolving needs of existing interconnection technology and future area array technology.

The composite interconnection elements of the present invention exhibit superior electrical characteristics, including electrical conductivity, solderability and low contact resistance. In many cases, deflection of the interconnection element in response to applied contact forces results in a "wiping" contact, which helps ensure that a reliable contact is made.

An additional advantage of the present invention is that connections made with the interconnection elements of the present invention are readily demountable. Soldering, to effect the interconnection to a terminal of an electronic component is optional, but is generally not preferred at a system level.

According to an aspect of the invention, techniques are described for making interconnection elements having controlled impedance. These techniques generally involve coating (e.g., electrophoretically) a conductive core or an entire composite interconnection element with a dielectric material (insulating layer), and overcoating the dielectric material with an outer layer of a conductive material. By grounding the outer conductive material layer, the resulting interconnection element can effectively be shielded, and its impedance can readily be controlled. (See also FIG. 10K of the PARENT CASE.)

According to an aspect of the invention, interconnection elements can be pre-fabricated as individual units, for later attachment to electronic components. Various techniques for accomplishing this objective are set forth herein. Although not specifically covered in this document, it is deemed to be relatively straightforward to fabricate a machine that will handle the mounting of a plurality of individual interconnection elements to a substrate or, alternatively, suspending a plurality of individual interconnection elements in an elastomer, or on a support substrate.

It should clearly be understood that the composite interconnection element of the present invention differs dramatically from interconnection elements of the prior art which have been coated to enhance their electrical conductivity characteristics or to enhance their resistance to corrosion.

The overcoating of the present invention is specifically intended to substantially enhance anchoring of the interconnection element to a terminal of an electronic component and/or to impart desired resilient characteristics to the resulting composite interconnection element. Stresses (contact forces) are directed to portions of the interconnection elements which are specifically intended to absorb the stresses.

It should also be appreciated that the present invention provides essentially a new technique for making spring structures. Generally, the operative structure of the resulting spring is a product of plating, rather than of bending and shaping. This opens the door to using a wide variety of materials to establish the spring shape, and a variety of "friendly" processes for attaching the "falsework" of the core to electronic components. The overcoating functions as a "superstructure" over the "falsework" of the core, both of which terms have their origins in the field of civil engineering.

A distinct advantage of the present invention is that probe elements (resilient contact structures) can be fabricated directly on terminals of a semiconductor device without requiring additional materials, such as brazing or soldering.

According to an aspect of the invention, any of the resilient contact structures may be formed as at least two composite interconnection elements.

Among the benefits of the present invention are:

(a) the composite interconnection elements are all metallic, permitting burn-in to be performed at elevated temperatures and, consequently, in a shorter time.

(b) the composite interconnection elements are freestanding, and are generally not limited by the bond pad layout of semiconductor devices.

(c) the composite interconnection elements of the present invention can be fashioned to have their tips at a greater pitch (spacing) than their bases, thereby immediately (e.g., at the first level interconnect) commencing and facilitating the process of spreading pitch from semiconductor pitch (e.g., 10 mils) to wiring substrate pitch (e.g., 100 mils).

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

Figure 1A:
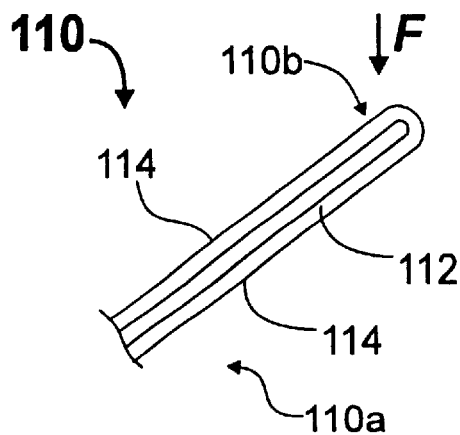
FIG. 1A is a cross-sectional view of a longitudinal portion, including one end, of an interconnection element, according to an embodiment of the invention.

In the side views presented herein, often portions of the side view are presented in cross-section, for illustrative clarity. For example, in many of the views, the wire stem is shown full, as a bold line, while the overcoat is shown in true cross-section (often without crosshatching).

In the figures presented herein, the size of certain elements are often exaggerated (not to scale, vis-a-vis other elements in the figure), for illustrative clarity.

DETAILED DESCRIPTION OF THE INVENTION

This patent application is directed to techniques of testing (including exercising and performing burn-in) semiconductor devices while they are resident on a semiconductor wafer (i.e., prior to their being singulated from the wafer). As will be evident from the description that follows, the techniques involve fabricating resilient contact structures directly upon the semiconductor devices, making pressure connections to the resilient contact structures for testing the semiconductor devices, and using the same resilient contact structures to connect to the semiconductor die after it is singulated from the wafer. Preferably, the resilient contact structures are implemented as "composite interconnection elements", such as have been described in the disclosure of the aforementioned U.S. patent application Ser. No. 08/452,255, filed May 26, 1995 ("PARENT CASE"), incorporated by reference herein. This patent application summarizes several of the techniques disclosed in the PARENT CASE in the discussions of FIGS. 1A–1E and 2A–2I.

An important aspect of the preferred technique for practicing the present invention is that a "composite" interconnection element can be formed by starting with a core (which may be mounted to a terminal of an electronic component), then overcoating the core with an appropriate material to: (1) establish the mechanical properties of the resulting composite interconnection element; and/or (2) when the interconnection element is mounted to a terminal of an electronic component, securely anchor the interconnection element to the terminal. In this manner, a resilient interconnection element (spring element) can be fabricated, starting with a core of a soft material which is readily shaped into a springable shape and which is readily attached to even the most fragile of electronic components. In light of prior art techniques of forming spring elements from hard materials, is not readily apparent, and is arguably counter-intuitive, that soft materials can form the basis of spring elements. Such a "composite" interconnection element is generally the preferred form of resilient contact structure for use in the embodiments of the present invention.

FIGS. 1A, 1B, 1C and 1D illustrate, in a general manner, various shapes for composite interconnection elements, according to the present invention.

In the main, hereinafter, composite interconnection elements which exhibit resiliency are described. However, it should be understood that non-resilient composite interconnection elements fall within the scope of the invention.

Further, in the main hereinafter, composite interconnection elements that have a soft (readily shaped, and amenable to affixing by friendly processes to electronic components) core, overcoated by hard (springy) materials are described. It is, however, within the scope of the invention that the core can be a hard material—the overcoat serving primarily to securely anchor the interconnection element to a terminal of an electronic component.

In FIG. 1A, an electrical interconnection element 110 includes a core 112 of a "soft" material (e.g., a material having a yield strength of less than 40,000 psi), and a shell (overcoat) 114 of a "hard" material (e.g., a material having a yield strength of greater than 80,000 psi). The core 112 is an elongate element shaped (configured) as a substantially straight cantilever beam, and may be a wire having a diameter of 0.0005–0.0030 inches (0.001 inch=1 mil≈25 microns ($\mu$m)). The shell 114 is applied over the already-shaped core 112 by any suitable process, such as by a suitable plating process (e.g., by electrochemical plating).

FIG. 1A illustrates what is perhaps the simplest of spring shapes for an interconnection element of the present invention—namely, a straight cantilever beam oriented at an angle to a force "F" applied at its tip 110b. When such a force is applied by a terminal of an electronic component to which the interconnection element is making a pressure contact, the downward (as viewed) deflection of the tip will evidently result in the tip moving across the terminal, in a "wiping" motion. Such a wiping contact ensures a reliable contact being made between the interconnection element and the contacted terminal of the electronic component.

By virtue of its "hardness", and by controlling its thickness (0.00025–0.00500 inches), the shell 114 imparts a desired resiliency to the overall interconnection element 110. In this manner, a resilient interconnection between electronic components (not shown) can be effected between the two ends 110a and 110b of the interconnection element 110. (In FIG. 1A, the reference numeral 110a indicates an end portion of the interconnection element 110, and the actual end opposite the end 110b is not shown.) In contacting a terminal of an electronic component, the interconnection element 110 would be subjected to a contact force (pressure), as indicated by the arrow labelled "F".

It is generally preferred that the thickness of the overcoat (whether a single layer or a multi-layer overcoat) be thicker than the diameter of the wire being overcoated. Given the fact that the overall thickness of the resulting contact structure is the sum of the thickness of the core plus twice the thickness of the overcoat, an overcoat having the same thickness as the core (e.g., 1 mil) will manifest itself, in aggregate, as having twice the thickness of the core.

The interconnection element (e.g., 110) will deflect in response to an applied contact force, said deflection (resiliency) being determined in part by the overall shape of the interconnection element, in part by the dominant (greater) yield strength of the overcoating material (versus that of the core), and in part by the thickness of the overcoating material.

As used herein, the terms "cantilever" and "cantilever beam" are used to indicate that an elongate structure (e.g., the overcoated core 112) is mounted (fixed) at one end, and the other end is free to move, typically in response to a force acting generally transverse to the longitudinal axis of the elongate element. No other specific or limiting meaning is intended to be conveyed or connoted by the use of these terms.

Figure 1B:
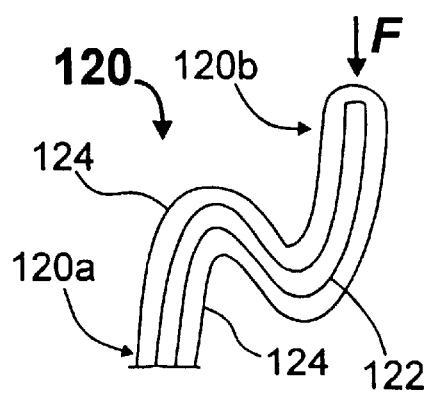
FIG. 1B is a cross-sectional view of a longitudinal portion, including one end, of an interconnection element, according to another embodiment of the invention.

In FIG. 1B, an electrical interconnection element 120 similarly includes a soft core 122 (compare 112) and a hard shell 124 (compare 114). In this example, the core 122 is shaped to have two bends, and thus may be considered to be S-shaped. As in the example of FIG. 1A, in this manner, a resilient interconnection between electronic components (not shown) can be effected between the two ends 120a and 120b of the interconnection element 120. (In FIG. 1B, reference numeral 120a indicates an end portion of the interconnection element 120, and the actual end opposite the end 120b is not shown.) In contacting a terminal of an electronic component, the interconnection element 120 would be subjected to a contact force (pressure), as indicated by the arrow labelled "F".

Figure 1C:
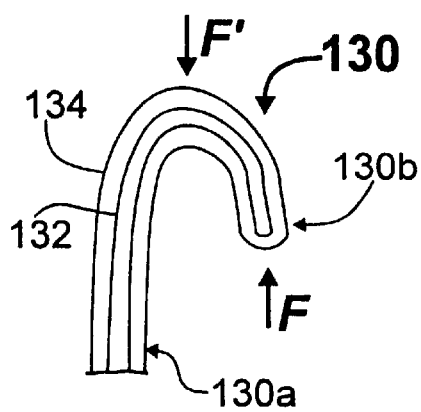
FIG. 1C is a cross-sectional view of a longitudinal portion, including one end of an interconnection element, according to another embodiment of the invention.

In FIG. 1C, an electrical interconnection element 130 similarly includes a soft core 132 (compare 112) and a hard shell 134 (compare 114). In this example, the core 132 is shaped to have one bend, and may be considered to be U-shaped.

As in the example of FIG. 1A, in this manner, a resilient interconnection between electronic components (not shown) can be effected between the two ends 130a and 130b of the interconnection element 130. (In FIG. 1C, the reference numeral 130a indicates an end portion of the interconnection element 130, and the actual end opposite the end 130b is not shown.) In contacting a terminal of an electronic component, the interconnection element 130 could be subjected to a contact force (pressure), as indicated by the arrow labelled "F". Alternatively, the interconnection element 130 could be employed to make contact at other than its end 130b, as indicated by the arrow labelled "F'".

Figure 1D:
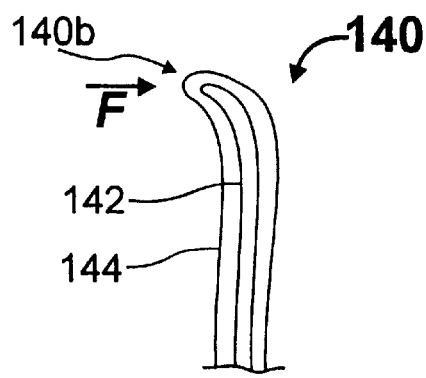
FIG. 1D is a cross-sectional view of a longitudinal portion, including one end of an interconnection element, according to another embodiment of the invention.

FIG. 1D illustrates another embodiment of a resilient interconnection element 140 having a soft core 142 and a hard shell 144. In this example, the interconnection element 140 is essentially a simple cantilever (compare FIG. 1A), with a curved tip 140b, subject to a contact force "F" acting transverse to its longitudinal axis.

Figure 1E:
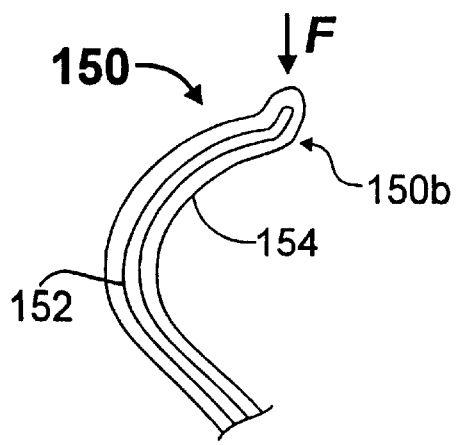
FIG. 1E is a cross-sectional view of a longitudinal portion, including one end of an interconnection element, according to another embodiment of the invention.

FIG. 1E illustrates another embodiment of a resilient interconnection element 150 having a soft core 152 and a hard shell 154. In this example, the interconnection element 150 is generally "C-shaped", preferably with a slightly curved tip 150b, and is suitable for making a pressure contact as indicated by the arrow labelled "F".

It should be understood that the soft core can readily be formed into any springable shape—in other words, a shape that will cause a resulting interconnection element to deflect resiliently in response to a force applied at its tip. For example, the core could be formed into a conventional coil shape. However, a coil shape would not be preferred, due to the overall length of the interconnection element and inductances (and the like) associated therewith and the adverse effect of same on circuitry operating at high frequencies (speeds).

The material of the shell, or at least one layer of a multi-layer shell (described hereinbelow) has a significantly higher yield strength than the material of the core. Therefore, the shell overshadows the core in establishing the mechanical characteristics (e.g., resiliency) of the resulting interconnection structure. Ratios of shell:core yield strengths are preferably at least 2:1, including at least 3:1 and at least 5:1, and may be as high as 10:1. It is also evident that the shell, or at least an outer layer of a multi-layer shell should be electrically conductive, notably in cases where the shell covers the end of the core. (The parent case, however, describes embodiments where the end of the core is exposed, in which case the core must be conductive.)

From an academic viewpoint, it is only necessary that the springing (spring shaped) portion of the resulting composite interconnection element be overcoated with the hard material. From this viewpoint, it is generally not essential that both of the two ends of the core be overcoated. As a practical matter, however, it is preferred to overcoat the entire core. Particular reasons for and advantages accruing to overcoating an end of the core which is anchored (attached) to an electronic component are discussed in greater detail hereinbelow.

Suitable materials for the core (112, 122, 132, 142) include, but are not limited to: gold, aluminum, copper, and their alloys. These materials are typically alloyed with small amounts of other metals to obtain desired physical properties, such as with beryllium, cadmium, silicon, magnesium, and the like. It is also possible to use silver, palladium, platinum; metals or alloys such as metals of the platinum group of elements. Solder constituted from lead, tin, indium, bismuth, cadmium, antimony and their alloys can be used.

Vis-a-vis attaching an end of the core (wire) to a terminal of an electronic component (discussed in greater detail hereinbelow), generally, a wire of any material (e.g., gold) that is amenable to bonding (using temperature, pressure and/or ultrasonic energy to effect the bonding) would be suitable for practicing the invention. It is within the scope of this invention that any material amenable to overcoating (e.g., plating), including non-metallic material, can be used for the core.

Suitable materials for the shell (114, 124, 134, 144) include (and, as is discussed hereinbelow, for the individual layers of a multi-layer shell), but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the platinum group and their alloys; tungsten and molybdenum. In cases where a solder-like finish is desired, tin, lead, bismuth, indium and their alloys can also be used.

The technique selected for applying these coating materials over the various core materials set forth hereinabove will, of course, vary from application-to-application. Electroplating and electroless plating are generally preferred techniques. Generally, however, it would be counter-intuitive to plate over a gold core. According to an aspect of the invention, when plating (especially electroless plating) a nickel shell over a gold core, it is desirable to first apply a thin copper initiation layer over the gold wire stem, in order to facilitate plating initiation.

An exemplary interconnection element, such as is illustrated in FIGS. 1A–1E may have a core diameter of approximately 0.001 inches and a shell thickness of 0.001 inches—the interconnection element thus having an overall diameter of approximately 0.003 inches (i.e., core diameter plus two times the shell thickness). Generally, this thickness of the shell will be on the order of 0.2–5.0 (one-fifth to five) times the thickness (e.g., diameter) of the core.

Some exemplary parameters for composite interconnection elements are:

(a) A gold wire core having a diameter of 1.5 mils is shaped to have an overall height of 40 mils and a generally C-shape curve (compare FIG. 1E) of 9 mils radius, is plated with 0.75 mils of nickel (overall diameter=1.5+2×0.75=3 mils), and optionally receives a final overcoat of 50 microinches of gold (e.g., to lower and enhance contact resistance). The resulting composite interconnection element exhibits a spring constant (k) of approximately 3–5 grams/mil. In use, 3–5 mils of deflection will result in a contact force of 9–25 grams. This example is useful in the context of a spring element for an interposer.

(b) A gold wire core having a diameter of 1.0 mils is shaped to have an overall height of 35 mils, is plated with 1.25 mils of nickel (overall diameter=1.0+2× 1.25=3.5 mils), and optionally receives a final overcoat of 50 microinches of gold. The resulting composite interconnection element exhibits a spring constant (k) of approximately 3 grams/mil, and is useful in the context of a spring element for a probe.

(c) A gold wire core having a diameter of 1.5 mils is shaped to have an overall height of 20 mils and a generally S-shape curve with radii of approximately 5 mils, is plated with 0.75 mils of nickel or copper (overall diameter=1.5+2×0.75=3 mils). The resulting composite interconnection element exhibits a spring constant (k) of approximately 2–3 grams/mil, and is useful in the context of a spring element for mounting on a semiconductor device.

As will be illustrated in greater detail hereinbelow, the core need not have a round cross-section, but may rather be a flat tab (having a rectangular cross-section) extending from a sheet. It should be understood that, as used herein, the term "tab" is not to be confused with the term "TAB" (Tape Automated Bonding).

Multi-layer Shells

Figure 2A:
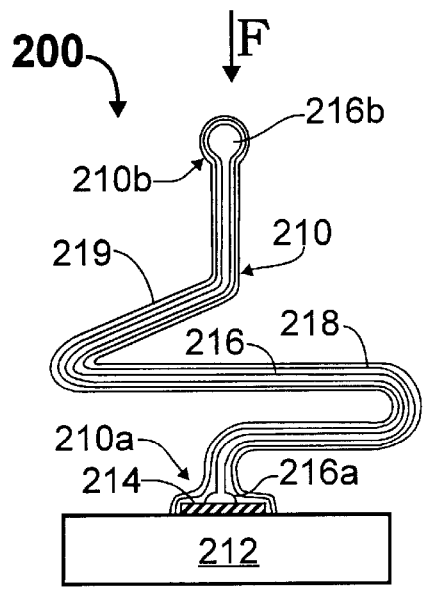
FIG. 2A is a cross-sectional view of an interconnection element mounted to a terminal of an electronic component and having a multi-layered shell, according to the invention.

FIG. 2A illustrates an embodiment 200 of an interconnection element 210 mounted to an electronic component 212 which is provided with a terminal 214. In this example, a soft (e.g., gold) wire core 216 is bonded (attached) at one end 216a to the terminal 214, is configured to extend from the terminal and have a spring shape (compare the shape shown in FIG. 1B), and is severed to have a free end 216b. Bonding, shaping and severing a wire in this manner is accomplished using wirebonding equipment. The bond at the end 216a of the core covers only a relatively small portion of the exposed surface of the terminal 214.

A shell (overcoat) is disposed over the wire core 216 which, in this example, is shown as being multi-layered, having an inner layer 218 and an outer layer 219, both of which layers may suitably be applied by plating processes. One or more layers of the multi-layer shell is (are) formed of a hard material (such as nickel and its alloys) to impart a desired resiliency to the interconnection element 210. For example, the outer layer 219 may be of a hard material, and the inner layer may be of a material that acts as a buffer or barrier layer (or as an activation layer, or as an adhesion layer) in plating the hard material 219 onto the core material 216. Alternatively, the inner layer 218 may be the hard material, and the outer layer 219 may be a material (such as soft gold) that exhibits superior electrical characteristics, including electrical conductivity and solderability. When a solder or braze type contact is desired, the outer layer of the interconnection element may be lead-tin solder or gold-tin braze material, respectively.

Anchoring to a Terminal

FIG. 2A illustrates, in a general manner, another key feature of the invention—namely, that resilient interconnection element can be securely anchored to a terminal on an electronic component. The attached end 210a of the interconnection element will be subject to significant mechanical stress, as a result of a compressive force (arrow "F") applied to the free end 210b of the interconnection element.

As illustrated in FIG. 2A, the overcoat (218, 219) covers not only the core 216, but also the entire remaining (i.e., other than the bond 216a) exposed surface of the terminal 214 adjacent the core 216 in a continuous (non-interrupted) manner. This securely and reliably anchors the interconnection element 210 to the terminal, the overcoat material providing a substantial (e.g., greater than 50%) contribution to anchoring the resulting interconnection element to the terminal. Generally, it is only required that the overcoat material cover at least a portion of the terminal adjacent the core. It is generally preferred, however, that the overcoat material cover the entire remaining surface of the terminal. Preferably, each layer of the shell is metallic.

As a general proposition, the relatively small area at which the core is attached (e.g., bonded) to the terminal is not well suited to accommodating stresses resulting from contact forces ("F") imposed on the resulting composite interconnection element. By virtue of the shell covering the entire exposed surface of the terminal (other than in the relatively small area comprising the attachment of the core end 216a to the terminal), the overall interconnection structure is firmly anchored to the terminal. The adhesion strength, and ability to react contact forces, of the overcoat will far exceed that of the core end (216a) itself.

As used herein, the term "electronic component" (e.g., 212) includes, but is not limited to: interconnect and interposer substrates; semiconductor wafers and dies, made of any suitable semiconducting material such as silicon (Si) or galliumarsenide (GaAs); production interconnect sockets; test sockets; sacrificial members, elements and substrates, as described in the parent case; semiconductor packages, including ceramic and plastic packages, and chip carriers; and connectors.

The interconnection element of the present invention is particularly well suited for use as:

interconnection elements mounted directly to silicon dies, eliminating the need for having a semiconductor package;

interconnection elements extending as probes from substrates (described in greater detail hereinbelow) for testing electronic components; and interconnection elements of interposers (discussed in greater detail hereinbelow).

The interconnection element of the present invention is unique in that it benefits from the mechanical characteristics (e.g., high yield strength) of a hard material without being limited by the attendant typically poor bonding characteristic of hard materials. As elaborated upon in the parent case, this is made possible largely by the fact that the shell (overcoat) functions as a "superstructure" over the "falsework" of the core, two terms which are borrowed from the milieu of civil engineering. This is very different from plated interconnection elements of the prior art wherein the plating is used as a protective (e.g., anti-corrosive) coating, and is generally incapable of imparting the desired mechanical characteristic to the interconnection structure. And this is certainly in marked contrast to any non-metallic, anticorrosive coatings, such as benzotriazole (BTA) applied to electrical interconnects.

Among the numerous advantages of the present invention are that a plurality of free-standing interconnect structures are readily formed on substrates, from different levels thereof such as a PCB having a decoupling capacitor) to a common height above the substrate, so that their free ends are coplanar with one another. Additionally, both the electrical and mechanical (e.g., plastic and elastic) characteristics of an interconnection element formed according to the invention are readily tailored for particular applications. For example, it may be desirable in a given application that the interconnection elements exhibit both plastic and elastic deformation. (Plastic deformation may be desired to accommodate gross non-planarities in components being interconnected by the interconnection elements.) When elastic behavior is desired, it is necessary that the interconnection element generate a threshold minimum amount of contact force to effect a reliable contact. It is also advantageous that the tip of the interconnection element makes a wiping contact with a terminal of an electronic component, due to the occasional presence of contaminant films on the contacting surfaces.

As used herein, the term "resilient", as applied to contact structures, implies contact structures (interconnection elements) that exhibit primarily elastic behavior in response to an applied load (contact force), and the term "compliant" implies contact structures (interconnection elements) that exhibit both elastic and plastic behavior in response to an applied load (contact force). As used herein, a "compliant" contact structure is a "resilient" contact structure. The composite interconnection elements of the present invention are a special case of either compliant or resilient contact structures.

A number of features are elaborated upon in detail, in the parent case, including, but not limited to: fabricating the interconnection elements on sacrificial substrates; gang-transferring a plurality of interconnection elements to an electronic component; providing the interconnection elements with contact tips, preferably with a rough surface finish; employing the interconnection elements on an electronic component to make temporary, then permanent connections to the electronic component; arranging the interconnection elements to have different spacing at their one ends than at their opposite ends; fabricating spring clips and alignment pins in the same process steps as fabricating the interconnection elements; employing the interconnection elements to accommodate differences in thermal expansion between connected components; eliminating the need for discrete semiconductor packages (such as for SIMMs); and optionally soldering resilient interconnection elements (resilient contact structures).

Controlled Impedance

Figure 2B:
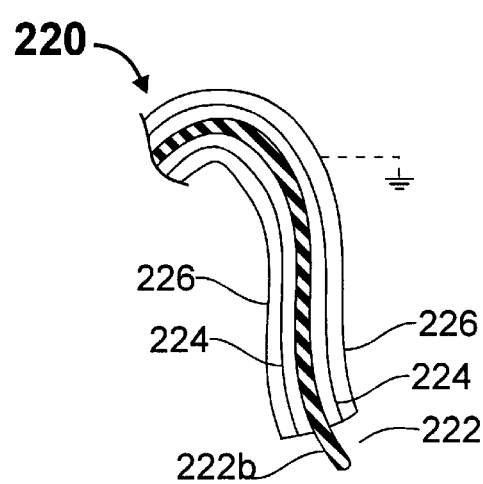
FIG. 2B is a cross-sectional view of an interconnection element having a multi-layered shell, wherein an intermediate layer is of a dielectric material, according to the invention.

FIG. 2B shows a composite interconnection element 220 having multiple layers. An innermost portion (inner elongate conductive element) 222 of the interconnection element 220 is either an uncoated core or a core which has been overcoated, as described hereinabove. The tip 222*b* of the innermost portion 222 is masked with a suitable masking material (not shown). A dielectric layer 224 is applied over the innermost portion 222 such as by an electrophoretic process. An outer layer 226 of a conductive material is applied over the dielectric layer 224.

In use, electrically grounding the outer layer 226 will result in the interconnection element 220 having controlled impedance. An exemplary material for the dielectric layer 224 is a polymeric material, applied in any suitable manner and to any suitable thickness (e.g., 0.1–3.0 mils).

The outer layer 226 may be multi-layer. For example, in instances wherein the innermost portion 222 is an uncoated core, at least one layer of the outer layer 226 is a spring material, when it is desired that the overall interconnection element exhibit resilience.

Altering Pitch

Figure 2C:
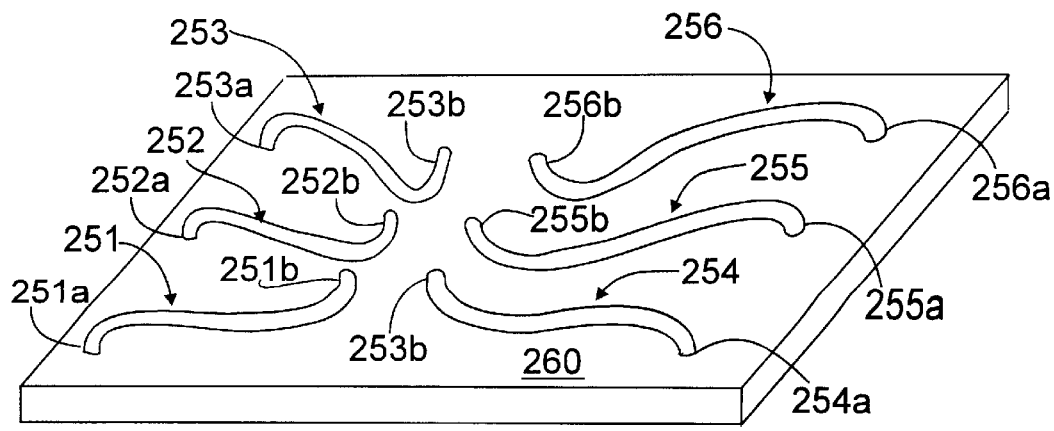
FIG. 2C is a perspective view of a plurality of interconnection elements mounted to an electronic component (e.g., a probe card insert), according to the invention.

FIG. 2C illustrates an embodiment 250 wherein a plurality (six of many shown) of interconnection elements 251 . . . 256 are mounted on a surface of an electronic component 260, such as a probe card insert (a subassembly mounted in a conventional manner to a probe card). Terminals and conductive traces of the probe card insert are omitted from this view, for illustrative clarity. The attached ends 251*a* . . . 256*a* of the interconnection elements 251 . . . 256 originate at a first pitch (spacing), such as 0.050–0.100 inches. The interconnection elements 251 . . . 256 are shaped and/or oriented so that their free ends (tips) are at a second, finer pitch, such as 0.005–0.010 inches. An interconnect assembly which makes interconnections from a one pitch to another pitch is typically referred to as a "space transformer".

A benefit of the present invention is that space transformation can be accomplished by the contact structures (interconnection elements) themselves (at first level interconnect), without the intermediary of another component, such as the discrete assembly of the aforementioned U.S. Pat. No. 5,414.298.

As illustrated, the tips 251*b* . . . 256*b* of the interconnection elements are arranged in two parallel rows, such as for making contact to (for testing and/or burning in) a semiconductor device having two parallel rows of bond pads (contact points). The interconnection elements can be arranged to have other tip patterns, for making contact to electronic components having other contact point patterns, such as arrays.

Generally, throughout the embodiments disclosed herein, although only one interconnection element may be shown, the invention is applicable to fabricating a plurality of interconnection components and arranging the plurality of interconnection elements in a prescribed spatial relationship with one another, such as in a peripheral pattern or in a rectangular array pattern.

Use of Sacrificial Substrates

The mounting of interconnection elements directly to terminals of electronic components has been discussed hereinabove. Generally speaking, the interconnection elements of the present invention can be fabricated upon, or mounted to, any suitable surface of any suitable substrate, including sacrificial substrates.

Attention is directed to the PARENT CASE, which describes, for example with respect to FIGS. 11A–11F fabricating a plurality of interconnection structures (e.g., resilient contact structures) as separate and distinct structures for subsequent mounting to electronic components, and which describes with respect to FIGS. 12A–12C mounting a plurality of interconnection elements to a sacrificial substrate (carrier) then transferring the plurality of interconnection elements en masse to an electronic component.

Figure 2D:
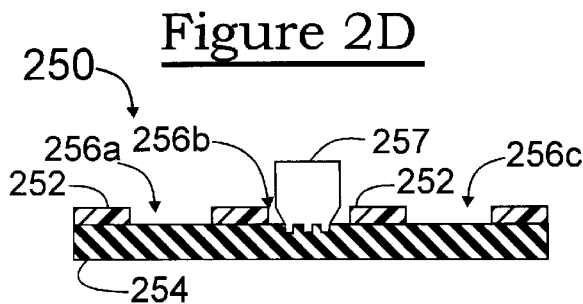
FIG. 2D is a cross-sectional view of an exemplary first step of a technique for manufacturing interconnection elements, according to the invention.
Figure 2E:
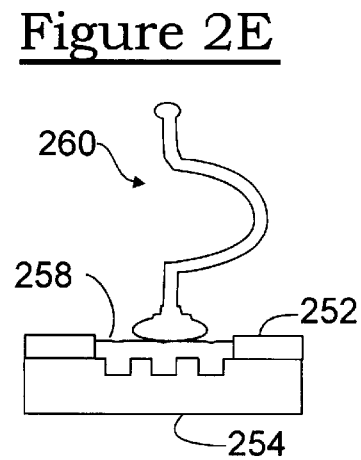
FIG. 2E is a cross-sectional view of an exemplary further step of the technique of FIG. 2D for manufacturing interconnection elements, according to the invention.
Figure 2F:
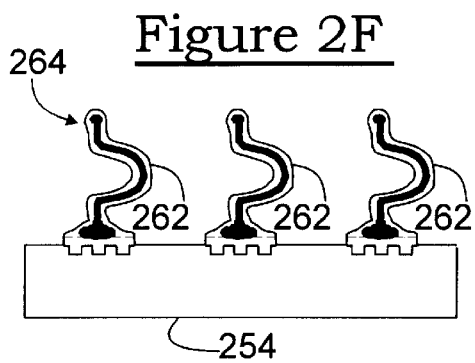
FIG. 2F is a cross-sectional view of an exemplary further step of the technique of FIG. 2E for manufacturing interconnection elements, according to the invention.

FIGS. 2D–2F illustrate a technique for fabricating a plurality of interconnection elements having preformed tip structures, using a sacrificial substrate.

FIG. 2D illustrates a first step of the technique 250, in which a patterned layer of masking material 252 is applied onto a surface of a sacrificial substrate 254. The sacrificial substrate 254 may be of thin (1–10 mil) copper or aluminum foil, by way of example, and the masking material 252 may be common photoresist. The masking layer 252 is patterned to have a plurality (three of many shown) of openings at locations 256*a*, 256*b*, 256*c* whereat it is desired to fabricate interconnection elements. The locations 256*a*, 256*b* and 256*c* are, in this sense, comparable to the terminals of an electronic component. The locations 256*a*, 256*b* and 256*c* are preferably treated at this stage to have a rough or featured surface texture. As shown, this may be accomplished mechanically with an embossing tool 257 forming depressions in the foil 254 at the locations 256*a*, 256*b* and 256*c*. Alternatively, the surface of the foil at these locations can be chemically etched to have a surface texture. Any technique suitable for effecting this general purpose is within the scope of this invention, for example sand blasting, peening and the like.

Next, a plurality (one of many shown) of conductive tip structures 258 are formed at each location (e.g., 256b), as illustrated by FIG. 2E. This may be accomplished using any suitable technique, such as electroplating, and may include tip structures having multiple layers of material. For example, the tip structure 258 may have a thin (e.g., 10–100 microinch) barrier layer of nickel applied onto the sacrificial substrate, followed by a thin (e.g., 10 microinch) layer of soft gold, followed by a thin (e.g., 20 microinch) layer of hard gold, followed by a relatively thick (e.g., 200 microinch) layer of nickel, followed by a final thin (e.g., 100 microinch) layer of soft gold. Generally, the first thin barrier layer of nickel is provided to protect the subsequent layer of gold from being "poisoned" by the material (e.g., aluminum, copper) of the substrate 254, the relatively thick layer of nickel is to provide strength to the tip structure, and the final thin layer of soft gold provides a surface which is readily bonded to. The invention is not limited to any particulars of how the tip structures are formed on the sacrificial substrate, as these particulars would inevitably vary from application-to-application.

As illustrated by FIG. 2E, a plurality (one of many shown) of cores 260 for interconnection elements may be formed on the tip structures 258, such as by any of the techniques of bonding a soft wire core to a terminal of an electronic component described hereinabove. The cores 260 are then overcoated with a preferably hard material 262 in the manner described hereinabove, and the masking material 252 is then removed, resulting in a plurality (three of many shown) of free-standing interconnection elements 264 mounted to a surface of the sacrificial substrate, as illustrated by FIG. 2F.

In a manner analogous to the overcoat material covering at least the adjacent area of a terminal (214) described with respect to FIG. 2A, the overcoat material 262 firmly anchors the cores 260 to their respective tip structures 258 and, if desired, imparts resilient characteristics to the resulting interconnection elements 264. As noted in the PARENT CASE, the plurality of interconnection elements mounted to the sacrificial substrate may be gang-transferred to terminals of an electronic component. Alternatively, two widely divergent paths may be taken.

It is within the scope of this invention that a silicon wafer can be used as the sacrificial substrate upon which tip structures are fabricated, and that tip structures so fabricated may be joined (e.g., soldered, brazed) to resilient contact structures which already have been mounted to an electronic component. Further discussion of these techniques are found in FIGS. 8A–8E, hereinbelow.

Figure 2G:
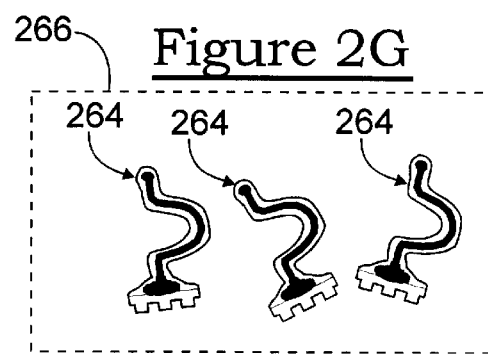
FIG. 2G is a cross-sectional view of an exemplary plurality of individual interconnection elements fabricated according to the technique of FIGS. 2D–2F, according to the invention.

As illustrated by FIG. 2G, the sacrificial substrate 254 may simply be removed, by any suitable process such as selective chemical etching. Since most selective chemical etching processes will etch one material at a much greater rate than an other material, and the other material may slightly be etched in the process, this phenomenon is advantageously employed to remove the thin barrier layer of nickel in the tip structure contemporaneously with removing the sacrificial substrate. However, if need be, the thin nickel barrier layer can be removed in a subsequent etch step. This results in a plurality (three of many shown) of individual, discrete, singulated interconnection elements 264, as indicated by the dashed line 266, which may later be mounted (such as by soldering or brazing) to terminals on electronic components.

It bears mention that the overcoat material may also be slightly thinned in the process of removing the sacrificial substrate and/or the thin barrier layer. However, it is preferred that this not occur.

To prevent thinning of the overcoat, it is preferred that a thin layer of gold or, for example, approximately 10 microinches of soft gold applied over approximately 20 microinches of hard gold, be applied as a final layer over the overcoat material 262. Such an outer layer of gold is intended primarily for its superior conductivity, contact resistance, and solderability, and is generally highly impervious to most etching solutions contemplated to be used to remove the thin barrier layer and the sacrificial substrate.

Figure 2H:
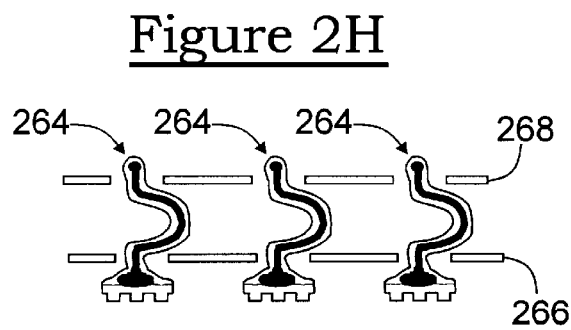
FIG. 2H is a cross-sectional view of an exemplary plurality of interconnection elements fabricated according to the technique of FIGS. 2D–2F, and associated in a prescribed spatial relationship with one another, according to the invention.

Alternatively, as illustrated by FIG. 2H, prior to removing the sacrificial substrate 254, the plurality (three of many shown) of interconnection elements 264 may be "fixed" in a desired spatial relationship with one another by any suitable support structure 266, such as by a thin plate having a plurality of holes therein, whereupon the sacrificial substrate is removed. The support structure 266 may be of a dielectric material, or of a conductive material overcoated with a dielectric material. Further processing steps (not illustrated) such as mounting the plurality of interconnection elements to an electronic component such as a silicon wafer or a printed circuit board may then proceed. Additionally, in some applications, it may be desireable to stabilize the tips (opposite the tip structures) of the interconnection elements 264 from moving, especially when contact forces are applied thereto. To this end, it may also be desirable to constrain movement of the tips of the interconnection elements with a suitable sheet 268 having a plurality of holes, such as a mesh formed of a dielectric material.

A distinct advantage of the technique 250 described hereinabove is that tip structures (258) may be formed of virtually any desired material and having virtually any desired texture. As mentioned hereinabove, gold is an example of a noble metal that exhibits excellent electrical characteristics of electrical conductivity, low contact resistance, solderability, and resistance to corrosion. Since gold is also malleable, it is extremely well-suited to be a final overcoat applied over any of the interconnection elements described herein, particularly the resilient interconnection elements described herein. Other noble metals exhibit similar desirable characteristics. However, certain materials such as rhodium which exhibit such excellent electrical characteristics would generally be inappropriate for overcoating an entire interconnection element. Rhodium, for example, is notably brittle, and would not perform well as a final overcoat on a resilient interconnection element. In this regard, techniques exemplified by the technique 250 readily overcome this limitation. For example, the first layer of a multi-layer tip structure (see 258) can be rhodium (rather than gold, as described hereinabove), thereby exploiting its superior electrical characteristics for making contact to electronic components without having any impact whatsoever on the mechanical behavior of the resulting interconnection element.

Figure 2I:
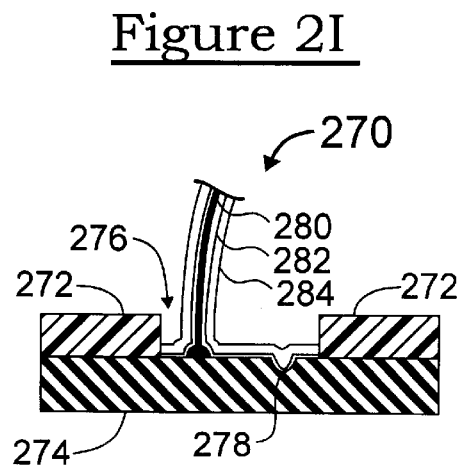
FIG. 2I is a cross-sectional view of an alternate embodiment for manufacturing interconnection elements, showing a one end of one element, according to the invention.

FIG. 2I illustrates an alternate embodiment 270 for fabricating interconnection elements. In this embodiment, a masking material 272 is applied to the surface of a sacrificial substrate 274, and is patterned to have a plurality (one of many shown) of openings 276, in a manner similar to the technique described hereinabove with respect to FIG. 2D. The openings 276 define areas whereat interconnection elements will be fabricated as free-standing structures. (As used throughout the descriptions set forth herein, an interconnection element is "free-standing" when is has a one end bonded to a terminal of an electronic component or to an area of a sacrificial substrate, and the opposite end of the interconnection element is not bonded to the electronic component or sacrificial substrate.)

The area within the opening may be textured, in any suitable manner, such as to have one or more depressions, as indicated by the single depression 278 extending into the surface of the sacrificial substrate 274.

A core (wire stem) 280 is bonded to the surface of the sacrificial substrate within the opening 276, and may have any suitable shape. In this illustration, only a one end of one interconnection element is shown, for illustrative clarity. The other end (not shown) may be attached to an electronic component. It may now readily be observed that the technique 270 differs from the aforementioned technique 250 in that the core 280 is bonded directly to the sacrificial substrate 274, rather than to a tip structure 258. By way of example, a gold wire core (280) is readily bonded, using conventional wirebonding techniques, to the surface of an aluminum substrate (274).

In a next step of the process (270), a layer 282 of gold is applied (e.g., by plating) over the core 280 and onto the exposed area of the substrate 274 within the opening 276, including within the depression 278. The primary purpose of this layer 282 is to form a contact surface at the end of the resulting interconnection element (i.e., once the sacrificial substrate is removed).

Next, a layer 284 of a relatively hard material, such as nickel, is applied over the layer 282. As mentioned hereinabove, one primary purpose of this layer 284 is to impart desired mechanical characteristics (e.g., resiliency) to the resulting composite interconnection element. In this embodiment, another primary purpose of the layer 284 is to enhance the durability of the contact surface being fabricated at the lower (as viewed) end of the resulting interconnection element. A final layer of gold (not shown) may be applied over the layer 284, to enhance the electrical characteristics of the resulting interconnection element.

In a final step, the masking material 272 and sacrificial substrate 274 are removed, resulting in either a plurality of singulated interconnection elements (compare FIG. 2G) or in a plurality of interconnection elements having a predetermined spatial relationship with one another (compare FIG. 2H).

This embodiment 270 is exemplary of a technique for fabricating textured contact tips on the ends of interconnection elements. In this case, an excellent example of a "gold over nickel" contact tip has been described. It is, however, within the scope of the invention that other analogous contact tips could be fabricated at the ends of interconnection elements, according to the techniques described herein. Another feature of this embodiment 270 is that the contact tips are constructed entirely atop the sacrificial substrate (274), rather than within the surface of the sacrificial substrate (254) as contemplated by the previous embodiment 250.

Mounting Spring Interconnect Elements Directly to Semiconductor Devices

Figure 3A:
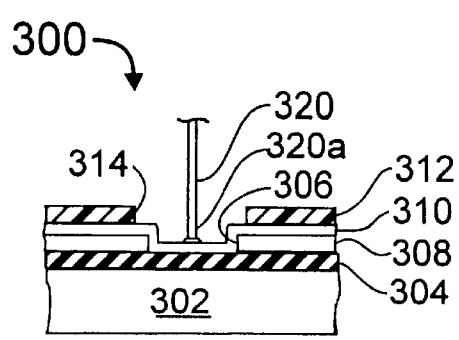
FIG. 3A is a side view of a wire having its free end bonded to a metal layer applied to a substrate, through an opening in a photoresist layer, according to the present invention.
Figure 3B:
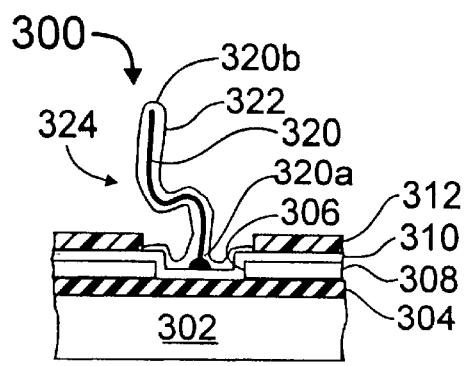
FIG. 3B is a side view of the substrate of FIG. 3A, with the wire overcoated, according to the present invention.
Figure 3C:
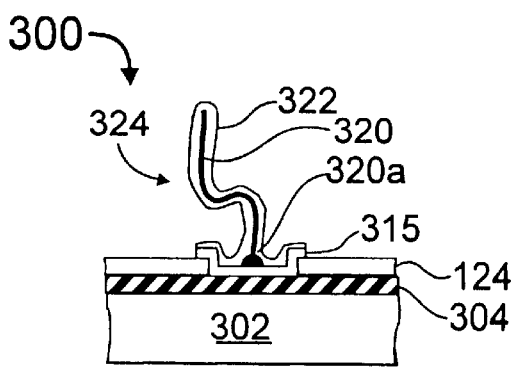
FIG. 3C is a side view of the substrate of FIG. 3B, with the photoresist layer removed and the metal layer partially removed, according to the present invention.

FIGS. 3A, 3B, and 3C are comparable to FIGS. 1C–1E of the PARENT CASE, and illustrate a preferred technique 300 for fabricating composite interconnections directly upon semiconductor devices, including unsingulated semiconductor devices.

According to conventional semiconductor processing techniques, a semiconductor device 302 has a patterned conductive layer 304. This layer 304 may be a top metal layer, which is normally intended for bond-out to the die, as defined by openings 306 in an insulating (e.g., passivation) layer 308 (typically nitride). In this manner, a bond pad would be defined which would have an area corresponding to the area of the opening 306 in the passivation layer 308. Normally (i.e., according to the prior art), a wire would be bonded to the bond pad.

According to the invention, a blanket layer 310 of metal material (e.g., aluminum) is deposited (such as by sputtering) over the passivation layer 308 in a manner that the conductive layer 310 conformally follows the topography of the layer 308, including "dipping" into the opening 306 and electrically contacting the layer 304. A patterned layer 312 of masking material (e.g., photoresist) is applied over the layer 310 with openings 314 aligned over the openings 306 in the passivation layer 308. Portions of the blanket conductive layer 310 are covered by the masking material 312, other portions of the blanket conductive layer 310 are exposed (not covered) within the openings 314 of the layer of masking material 312. The exposed portions of the blanket conductive layer 310, within the openings 314 will serve as "pads" or "terminals" (compare 214), and may be gold plated (not shown).

An important feature of this technique is that the opening 314 is larger than the opening 306. As will be evident, this will result in a larger bond area (defined by the opening 132) than is otherwise (as defined by the opening 306) present on the semiconductor die 302.

Another important feature of this technique is that the conductive layer 310 acts as a shorting layer to protect the device 302 from damage during a process of electronic flame off (EFO) of the wire stem (core) 320.

An end 320a of an inner core (wire stem) 320 is bonded to the top (as viewed) surface of the conductive layer 310, within the opening 314. The core 320 is configured to extend from the surface of the semiconductor die, to have a springable shape and is severed to have a tip 320b, in the manner described hereinabove (e.g., by electronic flame off). Next, as shown in FIG. 3B, the shaped wire stem 320 is overcoated with one or more layers of conductive material 322, as described hereinabove (compare FIG. 2A). In FIG. 3B it can be seen that the overcoat material 322 completely envelops the wire stem 320 and also covers the conductive layer 310 within the area defined by the opening 314 in the photoresist 312.

The photoresist 312 is then removed (such as by chemical etching, or washing), and the substrate is subjected to selective etching (e.g., chemical etching) to remove all of the material from the conductive layer 310 except that portion 315 (e.g., pad, terminal) of the layer 310 which is covered by the material 322 overcoating the wire stem 320. Portions of the blanket conductive layer 310 previously covered by the masking material 312, and not overcoated with the material 322, are removed in this step, while the remaining portions of the blanket conductive material 310 which have been overcoated by the material 322 are not removed. This results in the structure shown in FIG. 3C, a significant advantage of which is that the resulting composite interconnection element 324 is securely anchored (by the coating material 322) to an area (which was defined by the opening 314 in the photoresist) which can easily be made to be larger than what would otherwise (e.g., in the prior art) be considered to be the contact area of a bond pad (i.e., the opening 306 in the passivation layer 308).

Another important advantage of this technique is that a hermetically-sealed (completely overcoated) connection is effected between the contact structure 324 and the terminal (pad) 315 to which it is mounted.

The techniques described hereinabove generally set forth a novel method for fabricating composite interconnection elements, the physical characteristics of which are readily tailored to exhibit a desired degree of resiliency.

Generally, the composite interconnection elements of the present invention are readily mounted to (or fabricated upon) a substrate (particularly a semiconductor die) in a manner in which the tips (e.g., 320*b*) of the interconnection elements (e.g., 320) are readily caused to be coplanar with one another and can be at a different (e.g., greater pitch) than the terminals (e.g., bond pads) from which they originate.

It is within the scope of this invention that openings are made in the resist (e.g., 314) whereat resilient contact structures are not mounted. Rather, such openings could advantageously be employed to effect connections (such as by traditional wirebonding) to other pads on the same semiconductor die or on other semiconductor dies. This affords the manufacturer the ability to "customize" interconnections with a common layout of openings in the resist.

Figure 3D:
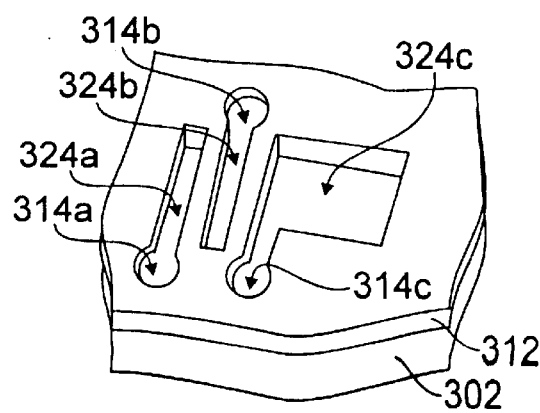
FIG. 3D is a perspective view of a semiconductor device, formed according to the techniques set forth in FIGS. 3A–3C, according to the present invention.

As shown in FIG. 3D, it is within the scope of this invention that the masking layer 312 can additionally be patterned, so as to leave additional conductive lines or areas upon the face of the semiconductor device 302 (i.e., in addition to providing openings 314 whereat the interconnection elements 324 are mounted and overcoated). This is illustrated in the figure by the "elongate" openings 324*a* and 324*b* extending to the openings 314*a* and 314*b*, respectively, and the "area" opening 324*c* optionally (as shown) extending to the opening 314*c*. (In this figure, elements 304, 308 and 310 are omitted, for illustrative clarity.) As set forth hereinabove, the overcoat material 322 will be deposited in these additional openings (324*a*, 324*b*, 324*c*), and will prevent portions of the conductive layer 310 underlying these openings from being removed. In the case of such elongated and area openings (324*a*, 324*b*, 324*c*) extending to contact openings (314*a*, 314*b*, 314*c*), the elongated and area openings will be electrically connected to corresponding ones of the contact structures. This is useful in the context of providing (routing) conductive traces between (interconnecting) two or more terminals (315) directly upon the face of the electronic component (e.g., semiconductor device) 302. This is also useful for providing ground and/or power planes directly upon the electronic component 302. This is also useful in the context of closely adjacent (e.g., interleaved) elongated areas (which when plated, become lines), such as the elongated areas 324*a* and 324*b*, which can serve as on-chip (302) capacitors. Additionally, providing openings in the masking layer 312 at other than the locations of the contact structures 324 can help uniformize deposition of the subsequent overcoat material 322.

It is within the scope of this invention that the contact structures (324) are pre-fabricated, for example in the manner of FIGS. 2D–2F described hereinabove, and brazed to the terminals 315, either with or without tips (258) having controlled topography. This includes mounting the prefabricated contact structures to unsingulated (from a semiconductor wafer) semiconductor dies on a one-by-one basis, or several semiconductor dies at once. Additionally, the topography of a tip structure (258, 820, 864) can be controlled to be flat, to make an effective pressure connection with a z-axis conductive adhesive (868), described hereinbelow.

Exercising Semiconductor Devices

A well-known procedure among integrated circuit (chip) manufacturers is the burn-in and functional testing of chips. These techniques are typically performed after packaging the chips, and are collectively referred to herein as "exercising".

Modern integrated circuits are generally produced by creating several, typically identical integrated circuit dies (usually as square or rectangular die sites) on a single (usually round) semiconductor wafer, then scribing and slicing the wafer to separate (singulate, dice) the dies (chips) from one another. An orthogonal grid of "scribe line" (kerf) areas extends between adjacent dies, and sometimes contain test structures, for evaluating the fabrication process. These scribe lines areas, and anything contained within them, will be destroyed when the dies are singulated from the wafer. The singulated (separated) dies are ultimately individually packaged, such as by making wire bond connections between bond pads on the die and conductive traces within the package body. "Burn-in" is a process whereby a chip (die) is either simply powered up ("static" burn-in), or is powered up and has signals exercising to some degree the functionality of the chip ("dynamic" burn-in). In both cases, burn-in is typically performed at an elevated temperature and by making "temporary" (or removable) connections to the chip—the object being to identify chips that are defective, prior to packaging the chips. Burn-in is usually performed on a die-by-die basis, after the dies are singulated (diced) from the wafer, but it is also known to perform burn-in prior to singulating the dies. Typically, the temporary connections to the dies are made by test probes of by "flying wires".

Functional testing can also be accomplished by making temporary connections to the dies. In some instances, each die is provided with built-in self test (self-starting, signal-generating) circuitry which will exercise some of the functionality of the chip. In many instances, a test jig must be fabricated for each die, with probe pins precisely aligned with bond pads on the particular die required to be exercised (tested and/or burned-in). These test jigs are relatively expensive, and require an inordinate amount of time to fabricate.

As a general proposition, package leads are optimized for assembly, not for burn-in (or functional testing). Prior art burn-in boards are costly, and are often subjected to thousands of cycles (i.e., generally one cycle per die that is tested). Moreover, different dies require different burn-in boards. Burn-in boards are expensive, which increases the overall cost of fabrication and which can only be amortized over large runs of particular devices.

Given that there has been some testing of the die prior to packaging the die, the die is packaged in order that the packaged die can be connected to external system components. As described hereinabove, packaging typically involves making some sort of "permanent" connection to the die, such as by bond wires. (Often, such "permanent" connections may be un-done and re-done, although this is not generally desirable.)

Evidently, the "temporary" connections required for burn-in and/or pre-packaging testing of the die(s) are often dissimilar from the "permanent" connections required for packaging the die(s).

It is an object of the present invention to provide a technique for making both temporary and permanent connections to electronic components, such as semiconductor dies, using the same interconnection structure.

It is a further object of the present invention to provide a technique for making temporary interconnections to dies, for performing burn-in and or testing of the dies, either before the dies are singulated from the wafer, or after the dies are singulated from the wafer.

It is a further object of the present invention to provide an improved technique for making temporary interconnections to dies, whether or not the same interconnect structure is employed to make permanent connections to the die(s).

According to the invention, resilient contact structures can serve "double duty" both as temporary and as permanent connections to an electronic component, such as a semiconductor die.

According to the present invention, resilient contact structures can be mounted directly to semiconductor dies, and the resilient contact structures can serve multiple purposes:

(a) the resilient contact structures can make reliable, temporary contact to test boards, which may be as simple and straightforward as ordinary printed circuit boards;

(b) the same resilient contact structures can make reliable permanent contact to circuit boards, when held in place by a spring clip, or the like; and (c) the same resilient contact structures can make reliable permanent connection to circuit boards, by soldering.

Chip-level Mounting Process

As mentioned hereinabove (e.g., with respect to FIGS. 3A–3C), it is well within the scope of this invention to mount the resilient contact structures of the present invention directly to (on) semiconductor dies. This is particularly significant when viewed against prior art techniques of wire bonding to dies which are disposed in some sort of package requiring external interconnect structures (e.g., pins, leads and the like).

Generally, the present invention provides a technique for mounting contact structures directly to semiconductor dies, without significantly heating the die. Generally, the bonding of the wire stem to the die and the subsequent overcoating (e.g., plating) of the wire stem are performed at temperatures which are relatively "trivial" when compared to device fabrication processes (e.g., plasma etching, reflow glass) which subject the dies to temperatures on the order of several hundreds of degrees Celsius (° C.). For example, bonding of gold wires will typically occur at 140°–175° C. Bonding of aluminum wires can occur at even lower temperatures, such as at room temperature. Plating temperatures are process dependent, but generally do not involve temperatures in excess of 100° C.

FIGS. 4A–4E illustrate the process of putting resilient contact structures on a silicon chip, or onto silicon chips (dies) prior to their having been singulated from a semiconductor wafer. An important feature of this process is the provision of a shorting layer (mentioned hereinabove with respect to the layer 310), which is important for overcoating the shaped wire stems of the resilient contact structures by electroplating (discussed hereinabove). Inasmuch as electroplating involves depositing material out of a solution in the presence of an electric field, and the electric field could damage sensitive semiconductor devices, as well as the fact that an electric arc (such as in electric flame-off techniques for severing the wire, as discussed hereinabove) certainly has the potential to damage semiconductor devices, the shorting layer will provide electrical protection, during the process, for such sensitive electronic components. Optionally, the shorting layer can also be grounded.

Figure 4A:
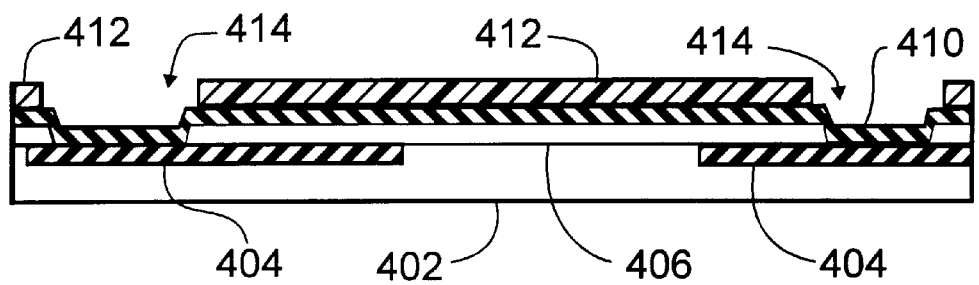
FIGS. 4A–4E are side views of a technique for mounting resilient contact structures to a semiconductor die, according to the present invention.

FIG. 4A shows a semiconductor substrate 402 having a plurality (two of many shown) bond pads 404. The bond pads 404 are covered by a passivation layer 406 (typically silicon nitride) which has openings over each of the bond pads 404. Typically, these openings in the passivation layer 406 permit a bond wire to be bonded to the bond pad, for wirebonding the substrate (e.g., die) to a leadframe or the like. For all intents and purposes, the openings in the passivation layer define the size (area) of the bond pad 404, irrespective of the fact that the metallization of the bond pad may (and typically will) extend beyond the opening in the passivation layer 406. (Typically, the bond pad, per se, is simply a location in a pattern of conductors in a layer of metallization.) The preceding is well known in the art of semiconductor fabrication, and additional layers of conductive, insulating and semiconducting material between the bond pads (top metallization layer) and the substrate 402 are omitted, for illustrative clarity. Typically, but not necessarily, the bond pads are all at the same level (e.g., if a preceding layer has been planarized) on the semiconductor substrate (device), and it is immaterial for the purposes of the present invention whether or not the bond pads are coplanar.

FIG. 4A further shows that the bond pads 404 are shorted together by a conductive layer 410 of aluminum, Ti—W—Cu (titanium-tungsten-copper), Cr—Cu (chromium-copper), or the like, applied by conventional processes to the entire surface of the substrate 402 (over the passivation layer 406 and into the openings in the passivation layer) so as to make electrical contact with the bond pads 404. A patterned layer of resist (photoresist) 412 is applied over the shorting layer 410, and is patterned to have openings 414 aligned directly over the bond pads 404. Notably, the openings 414 in the resist layer 412 can be of an arbitrary size, and are preferably larger than the openings in the passivation layer 406 so that a "virtual" bond pad (defined by the opening 414 through the resist 412 to the shorting layer 410) has a larger area than the "actual" bond pad 404. According to an aspect of the invention, the area of the virtual bond pad is significantly, such as up to 10%, 20%, 30%, 40%, 50%, 60%, 70%, 80%, 90% or 100% larger than the actual bond pad (as defined by the opening in the passivation layer. Typically, bond pads (and their openings) are square (as viewed from above). However, the particular shape of the bond pads is not particularly germane to the present invention, which is applicable to bond pads having rectangular, round or oval shapes, and the like.

Figure 4B:
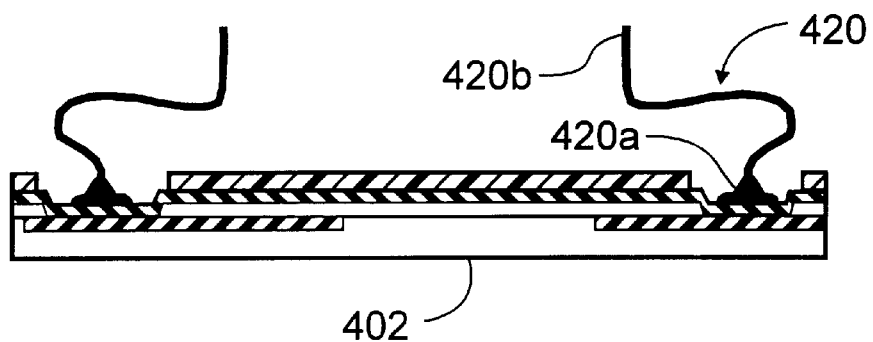

FIG. 4B illustrates a next step in the process of mounting resilient contact structures to the substrate 402. Wires 420 are bonded at their distal ends 420*a* to the shorting layer, in the openings 414, and fashioned to have a shape suitable for functioning as a resilient contact structure when overcoated. Generally, any of the above-mentioned techniques for fashioning, wire stem shapes can be employed in this step. In this example, the wire 420 is fashioned into a wire stem having a shape similar to the shape set forth in FIG. 2A.

Figure 4C:
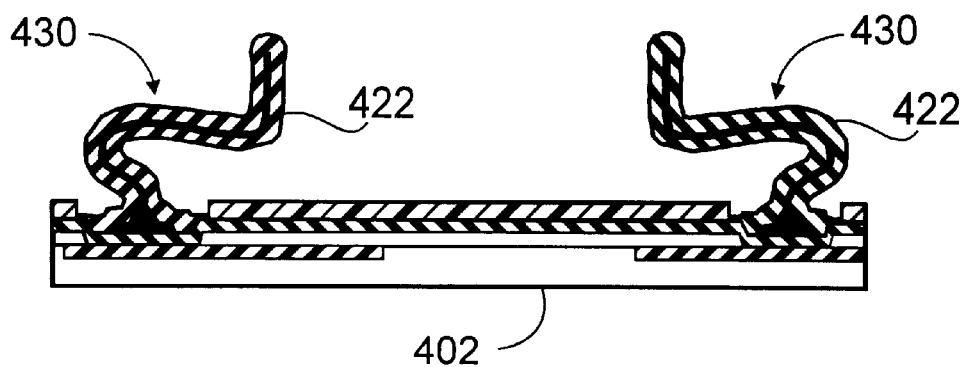
Figure 4D:
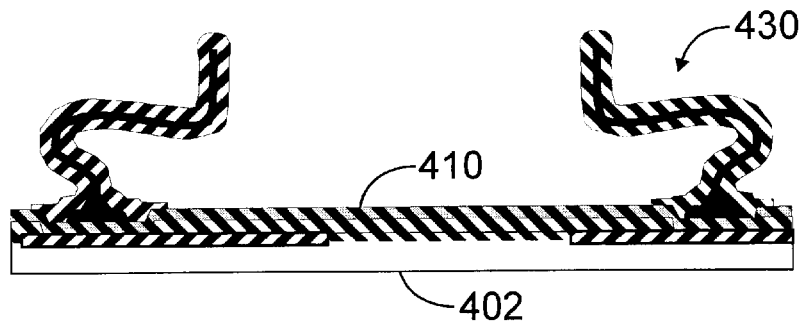

FIG. 4C illustrates a next step in the process of mounting resilient contact structures to the substrate 402, wherein the wire stems (shaped wires 420) are overcoated with one (or more) layer(s) 422 of a conductive material. (As in previous examples, only the topmost layer of multilayer coatings are required to be conductive.) Again, any of the aforementioned processes and materials for overcoating shaped wire stems may be employed in this step. In this example, the wire (1420) is electroplated (overcoated) with nickel. As in the previous examples, the overcoat is what determines the resiliency of the resulting contact structure, and also greatly enhances the anchoring of the contact structure to the substrate. In this example, the entire substrate is submersed in an electroplating bath, and nickel is plated up inherently selectively on the wire stems and in the openings 414 of the resist 412 (nickel will not electroplate to resist material) In this manner, resilient contact structures 430 are provided FIG. 4D illustrates a next step in the process of mounting resilient contact structures to the substrate 402, wherein the wire stems (1420) have been overcoated (1422) to form resilient contact structures 430. The resist 412 layer, evident in the last three steps, has been removed. At this point in the process, the virtual bond pads are simply contact areas (compare 110) on the continuous shorting layer 410.

Figure 4E:
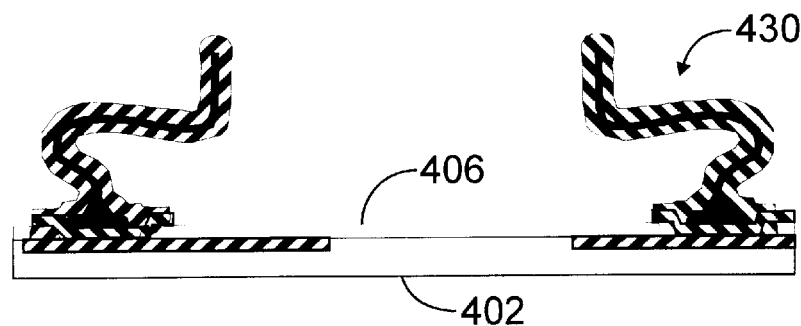

FIG. 4E illustrates a final step in the process of mounting resilient contact structures to the substrate 402. In this step the shorting layer 410 is removed at all location except under the overcoating 422. For shorting layers formed of materials that are readily selectively etched (i.e., without etching the overcoat material 422 or the passivation material 406), this can be accomplished by selective wet etching (i.e., by selecting the appropriate etchant). The only "basic" requirement to implement selective etching, in this example, is that the material of the layer 410 is different from the material of the coating 422, and that there is a reagent which will dissolve the one (1410) without dissolving the other (422). This is well within the purview of one having ordinary skill in the art to which the present invention most nearly pertains.

A distinct advantage of the process of the present invention is that a larger "virtual" contact area is created than otherwise existed (i.e., in the opening of the passivation layer). The overcoat 422 firmly anchors the wire stem 420 to this virtual contact area, greatly increasing the base adhesion of the wire stem. Moreover, although a die substrate may have square (or rectangular, or round) actual contact pads, the process of the present invention allows for the creation of virtual contact pads (openings in the resist 412 of any profile (e.g., rectangular, round, oval, etc.). Moreover, it is only required that the virtual contact pad overlap the actual contact pad. In other words, the center of the virtual contact pad can be offset from the center of the actual contact pad. This permits "staggering" the tips (distal ends) of the resilient contacts, a feature which would otherwise (if bonding directly to a linear array of actual contact pads) would require fashioning at least two different wire shapes or orientations.

As mentioned hereinabove, this process of mounting resilient contact structures (430) to a substrate can be performed on a already-singulated die, or on dies (die sites) prior to their having been singulated from a semiconductor wafer.

The steps described hereinabove can also be performed on semiconductor dies which have not been singulated from a wafer. (See FIG. 5, hereinbelow, for a discussion of mounting contact structures to dies prior to singulating the dies from the wafer.)

Figure 4F:
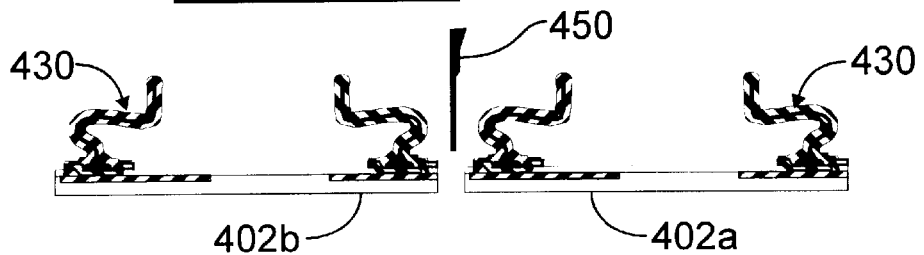
FIGS. 4F and 4G are side views of a technique, similar to that described with respect to FIGS. 4A–4E, for mounting resilient contact structures to semiconductor dies prior to their singulation from a wafer, according to the present invention.
Figure 4G:
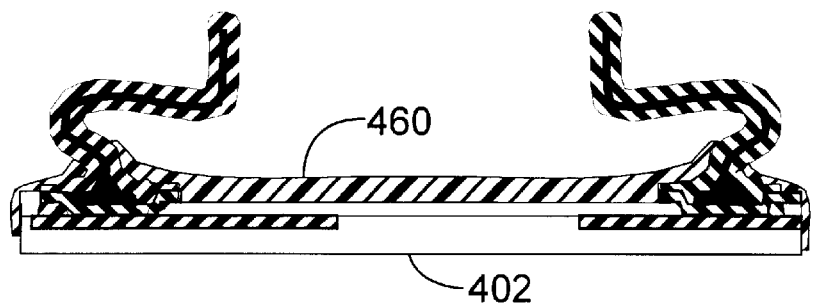

FIGS. 4F and 4G, discussed immediately hereinbelow, describe a process similar to the process of FIGS. 4A–4E, but wherein contact structures are applied to dies prior to singulating the dies from a wafer.

FIG. 4F illustrates a post-finishing step wherein the resilient contact structures 430 have been mounted to a plurality of die sites 402a and 402b (two of many shown) on a semiconductor wafer. A suitable scribing or kerfing tool 450 (such as a saw) is brought to bear on the wafer, between adjacent die sites, resulting in a plurality of singulated dies, each die having resilient contact structures mounted thereto.

FIG. 4G illustrates another, optional post-finishing step, which can be performed prior to or after (i.e., independently of) the post-finishing step shown in FIG. 4F. In this step, a suitable hermetic (e.g., polymer) coating 460 is applied to the surface of the substrate, covering the entire surface as well as the proximal ends 430a of the resilient contact structures 430, as well as the edges of the substrate (as shown). Typically (i.e., preferably) such coatings are an insulating material, and covering the distal end (tip) 430b of the resilient contact structure 430 is to be avoided (as shown). If not avoidable, insulating material (1460) covering the tip 430b of the resilient contact structure must be removed. Additionally, coating any more than an incidental (very small) portion of the length of the resilient contact structure with the insulating material (1460) is to be rigorously avoided, as the insulating material may alter the resilient (spring) characteristics of the contact structure 430 imparted thereto (largely) by the overcoat 422. This step represents an important feature of the invention in that semiconductor dies, especially the aluminum bond pads thereof, can hermetically be sealed from the environment (atmosphere). Such hermetic sealing of the die permits the use of less hermetic (and typically less expensive) packages to be used. For example, ceramic packages are very hermetic (moisture proof) and very expensive. Plastic packages are less hermetic, and less expensive. PCB-substrate type packages tend to be even less hermetic, and comparable in cost to plastic packages.

Wafer-level Mounting Resilient Contact Structures

Discussions set forth hereinabove have generally emphasized mounting the resilient contact structures of the present invention to discrete substrates, including to semiconductor dies. The present invention is of broader scope, and is especially advantageous for mounting the resilient contact structures of the present invention to dies, prior to singulating (dicing) the dies from a wafer. This affords the opportunity to perform testing and burn-in of unsingulated dies prior to dicing them from the wafer, using the resilient interconnection techniques of the present invention. The mounting of contact structures to unsingulated dies has been briefly discussed hereinabove, with respect to FIGS. 4F and 4G.

Generally, in the prior art, testing unsingulated dies at wafer-level required some sort of die selection techniques, whether electrical (e.g., die selection mechanism built into the wafer and/or dies) or mechanical (e.g., probes, flying wires, and the like), both of which tends to be complex and add a significant increment to the cost of production. The opportunity, according to the present invention, to construct "final" contact structures on unsingulated dies, and to use these contact structures both for testing and permanently connecting the dies, avoids these intermediate steps, and will also tend to be more economical than test-after-dice methodologies.

Additionally, during the fabrication of dies on a wafer, it is often the case that imperfections in the wafer will be identified prior to wafer processing. Any dies fabricated at such imperfect die sites should immediately be discarded (after dicing), without even "bothering" to test these dies.

Figure 5:
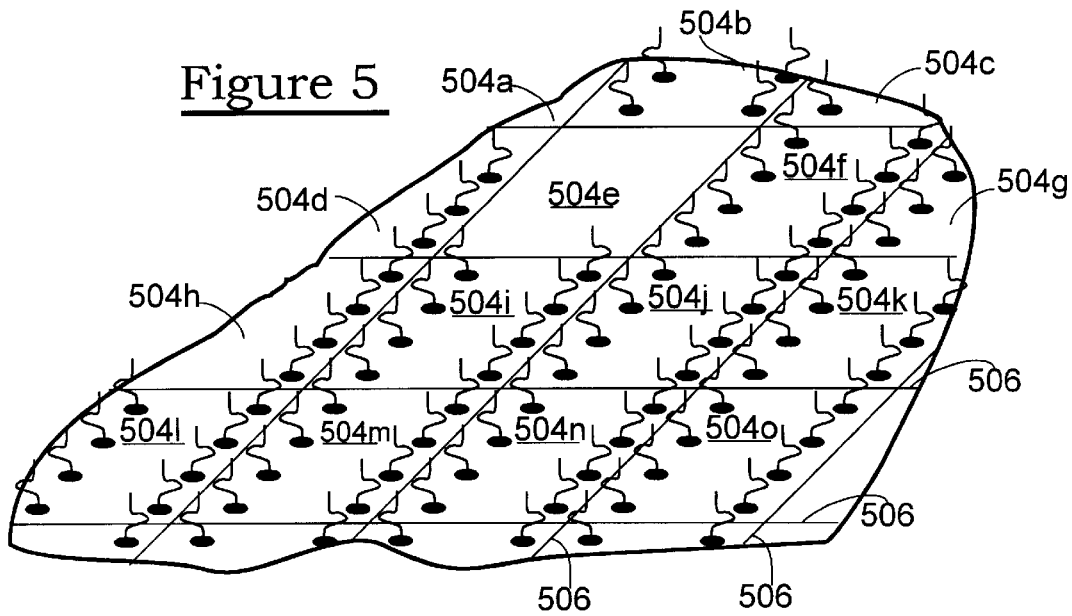
FIG. 5 is a perspective, partial view of a plurality of resilient contact structures mounted to multiple die sites on a semiconductor wafer, according to the present invention.

FIG. 5 illustrates a portion 502 of a semiconductor wafer, illustrating a plurality of die sites 504a . . . 504o defined by a grid of kerf (scribe) lines 506. Resilient contact structures 530 have been mounted to bond pads (not shown) on each of die sites 504a . . . 504d and 504f . . . 504o. Resilient contact structures (530) are not mounted to the die site 504e (which may have been determined, prior to mounting the resilient contact structures, to be defective). As shown in this figure, all of the resilient contact structures on a die site are "oriented" so no portion of the resilient contact structure occupies a position directly above a kerf line 506.

After singulating the dies from the wafer, they can be coated (or encapsulated) with a suitable insulating material, leaving the tips of the resilient contact structures exposed for subsequent interconnect to a board or to a card.

Generally, the ability to fabricate resilient contact structures directly on semiconductor dies, prior to singulating the dies from a wafer, represents a tremendous advantage in the overall process of manufacturing semiconductor devices. This can be exemplified by the following:

In a typical process flow of the prior art, dies are probed while on the wafer, then are diced from the wafer, then are mounted to a die attach pad on a leadframe, then are wirebonded to fingers of the leadframe, then the assembly of die and leadframe are inserted into a mold for encapsulation, and the resulting packaged die is removed from the mold, trimmed (e.g., of "flash") and formed (e.g., the portions of the leadframe fingers extending from the package body are formed into suitable gull-wing configurations or the like.

In a typical process flow of the present invention, dies are probed while on the wafer, resilient contact structures are mounted to the "good" (passed) dies, the dies are diced from the wafer, then the dies are coated or encapsulated. As a general proposition, it is preferred that probing dies in the manner described hereinabove be limited to dies having fewer than one hundred bond pads to be probed, such as memory devices. Nevertheless, probing dies at the wafer level (prior to singulation), especially for purposes of burn-in, is greatly facilitated by the disclosed process.

In FIG. 5, the resilient contact structures 530 on any are disposed on two sides of a die, and the resilient contact structures on any one side of the die are illustrated as all being shaped the same and oriented in the same direction. This establishes a "pitch", or spacing between tips of adjacent resilient contact structures which, as is evident, will be the same as the pitch of the bond pads to which the resilient contact structures are mounted.

This illustrates an advantage of the invention, in that resilient contact structures, suitable for connecting directly to a printed circuit board or the like, can be mounted directly to semiconductor (e.g., silicon) devices, to form a "chip size package".

Such a device, with resilient contact structures mounted directly thereto is ready for test and burn-in, and ready for interconnecting to a card or a board, as discussed, for example, with respect to FIGS. 7A and 7B, in greater detail hereinbelow.

For purposes of this discussion, it is assumed that a given semiconductor device will have a lower limit on how close bond pads can be disposed, especially a single row of bond pads, and that this lower limit establishes a pitch for what is termed herein the "pin-out" of the device. (It is understood that the term "pin-out" is typically used to describe the signal assignments of bond pads rather than their physical spacing.) This pin-out pitch tends to be relatively fine (small), as compared with pad spacing which can feasibly be achieved on printed circuit boards, which partially accounts for the general acceptance of using bond wires, lead frames, and the like, in the context of packaging dies, to amplify (spread) the pin-out pitch.

Generally, a critical constraint on board design is that contact (solder) pads must be spaced far enough apart so that, in some cases, conductive traces can pass therebetween to effect "complex" interconnection schemes. Moreover, as a general proposition, the larger the solder pad, the better, as it will "accept" more solder—making for a more reliable solder connection.

According to a feature of the invention, resilient contact structures having various shapes and orientations can be mounted to substrates (e.g., semiconductor dies), which is useful in increasing the effective pitch of the device pin-out.

Moreover, it is possible, when mounting resilient contact structures to singulated dies, it is a relatively straightforward matter to shape the contacts so that they extend beyond the perimeter of the die. Generally, when mounting resilient contact structures to electronic components, according to the present invention, the shape and extent of the wire stem (which will be overcoated) is virtually unconstrained, readily allowing for fan-out (increasing from a relatively small spacing, such as on a die, to relatively larger spacing, such as on a printed circuit board).

It is, however, within the scope of this invention that contact structures extending beyond the perimeter of a die can be mounted to unsingulated dies on a wafer. This would require, for example, sawing the wafer from the opposite side, since such contact structures would overlie the kerf lines.

Another advantage of the present invention is that, when the wire stem is plated (overcoated), the overcoat material can be permitted to build up in areas of the electronic component which are not specifically intended for making interconnections. For example, the edges of the electronic component could be plated while plating wire stems mounted to the face of the electronic component. Or, the opposite side of the electronic component can be plated while plating the wire stems. Generally, any area on the electronic component which is not masked will be plated. (In many of the embodiments described hereinabove, the contact area (e.g., 110) where the wire stem is bonded to the electronic component is defined by an opening in photoresist, or the like.)

Figure 5A:
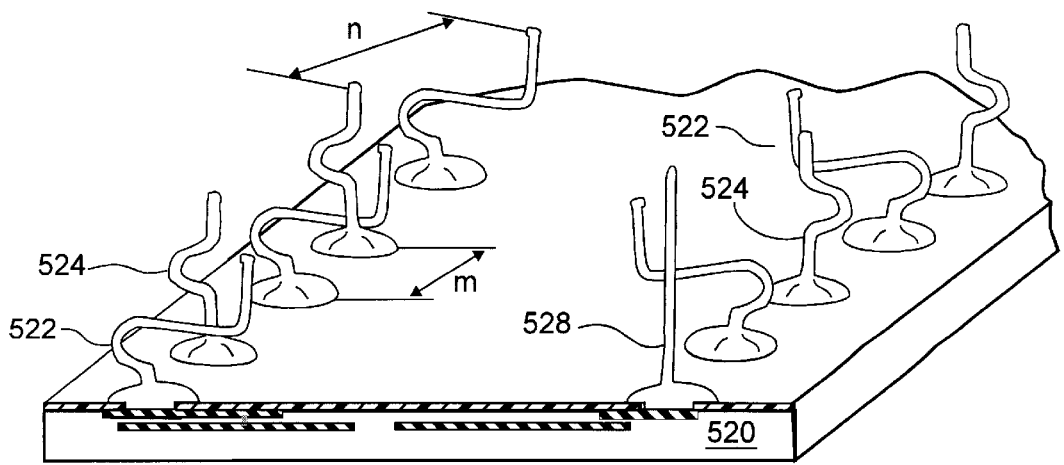
FIG. 5A is a perspective, partial view of a plurality of resilient contact structures mounted to a semiconductor die, and increasing the effective pitch of the "pin out" (bond pad spacing, as used herein), according to the present invention.

FIG. 5A illustrates an embodiment of the invention wherein the orientation of contact structures is staggered to increase their effective density, and is similar to FIG. 24 of CASE-2. The figure illustrates a semiconductor die 520 atop which a plurality of dissimilar contact structures have been mounted, according to the techniques set forth above. A first portion 522 of the contact structures are configured (shaped, bent) to have a relatively large offset (i.e., distal end from the proximal end). A second portion 524 of the contact structures are configured (shaped, bent) to have a relatively small offset (i.e., distal end from the proximal end). In this manner, as illustrated, the spacing between the proximal ends of adjacent contact structures (522 and 524) is "m", and the spacing between the distal ends of adjacent contact structures is "n", where n>m. For example, "m" is approximately five mils, and "n" is five-to-ten mils. As further shown in the figure, straight contact structures 528 extending normal to the surface of the electronic component 520 can be formed on the electronic component. These contact structures 528 are intended to function as alignment pins which will mate with corresponding alignment features (such as holes) on another electronic component such as a printed circuit board (PCB). Preferably, these alignment pins 528 are not resilient, but they may certainly be fabricated in the same process steps as the resilient contact structures 522 and 524.

Optionally, an encapsulant can be disposed on the surface of the substrate, encompassing the lower (as viewed) portions of the contact structures, mechanically reinforcing the attachment of the resilient contact structures to the surface of the substrate.

The staggering of the tips of the contact structures, according to the present invention, allows the designer to relax the "ground rules" (design rules) for a board to which the electronic component will be mounted, allowing for contact (soldering) pads disposed further from one another and/or larger individual soldering pads.

In use, temporary connections can be made to the electronic component 520 via the contact structures (522, 524 526), and subsequent permanent connections can be made to the electronic component 520 via the same contact structures (522, 524 526), in the manner discussed hereinabove with respect to FIGS. 7A and 7B (described hereinbelow). This facilitates wafer-level exercising (testing and burning-in) of un-singulated dies on a wafer, if desired, a feature which is particularly advantageous for semiconductor memory devices (but not limited thereto). It is within the scope of this invention that the contact structures 522, 524, 526 and 528 are gang-transferred to the wafer (or chip) 520, in the manner set forth hereinabove. The gang-transfer technique generally avoids the need to form a shorting layer (compare 126) on the electronic component, since the contact structures are fabricated "off-line" (i.e., on a sacrificial substrate).

No Shorting Layer Required

In a number of the embodiments described hereinabove, the use of a shorting layer has been described (see, e.g., conductive layer 310 in FIGS. 3A–3C). A shorting layer is useful when overcoating the wire stems by electroplating processes. The use of a conductive sacrificial structure, to which all of the wire stems are connected, also facilitates electroplating, by similarly shorting out (electrically connecting together) a plurality of wire stems.

Figure 6A:
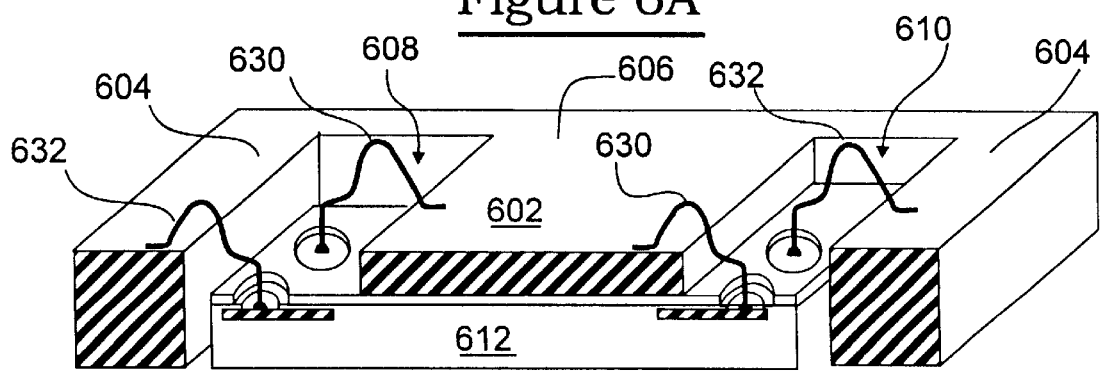
FIGS. 6A–6C are perspective views of a process for forming resilient contact structures on dies (either on a wafer or diced therefrom), according to the present invention.

FIG. 6A illustrates a first step in a process, wherein a sacrificial structure 602 is used in connection with shaping and overcoating a plurality of wire stems 630 and 632 mounted (bonded) to a semiconductor die 612.

The sacrificial structure 602 is formed as a cage-like structure, from a conductive (and readily removed, in a final step of the process) material, such as aluminum, and includes an outer ring 604 defining an area into which the die 612 is disposed, and a cross-bar 606 spanning from one side of the ring 604 (as shown) to an opposite side (not visible in this cross-sectional perspective drawing) of the ring 604. This results in their being openings 608 and 610 spanning from the one side of the ring to the opposite side of the ring, parallel to the cross-bar 606 (and to one another).

Generally, the sacrificial structure (cage) is positioned over the semiconductor die 612, so that the openings 608 and 610 are aligned with respective parallel rows of bond pads on the die 612, prior to mounting the wire stems 630 and 632 to the die 612.

As shown, the wire stems in each row of bond pads along a respective side of the die extend alternately to the outer ring 604 and the inner cross-bar 606, and are bonded to the sacrificial structure, such as by having their distal ends wedge-bonded thereto. In this manner, the sacrificial structure 602 shorts all of the wire stems together, and is readily connected to (not shown) for subsequent plating of the wire stems.

Figure 6B:
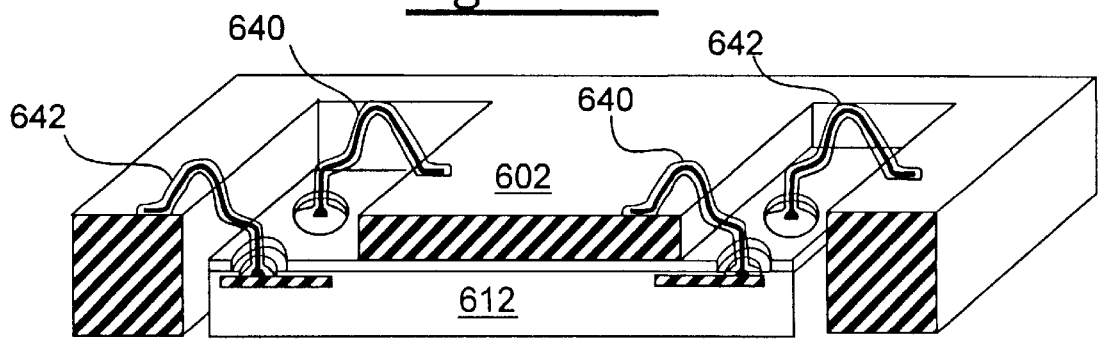

FIG. 6B shows a next step in the process, wherein the wire stems 630 and 632 are plated, in the manner described hereinabove, to function as resilient contact structures 640 and 642, respectively.

In the next step, it is desired to remove (eliminate) the sacrificial structure, and there are generally two possibilities: (i) the distal ends of the resilient contact structures can be severed (cut) from the sacrificial structure, or (ii) the sacrificial structure can be dissolved (e.g., etched) away without severing the tips of the resilient contact structure.

Figure 6C:
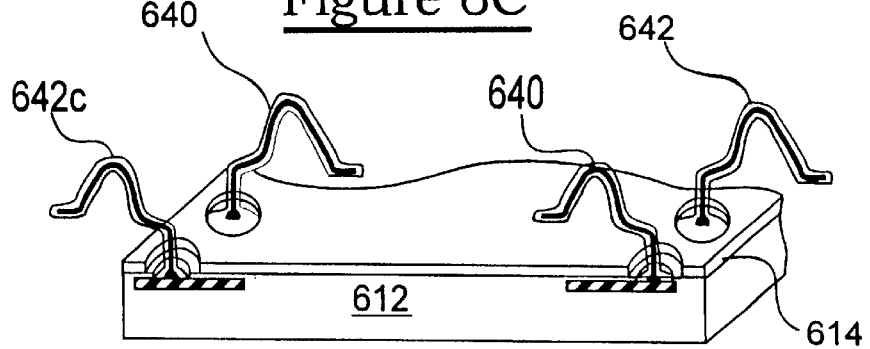

FIG. 6C shows the first possibility, wherein the sacrificial structure (602) has been dissolved away, leaving the die 612 with the resilient contact structures 640 and 642 mounted thereto. Whereas in most of the previous embodiments, it was generally intended that the extreme distal ends of the resilient contact structures make contact with another component, in this embodiment the resilient contact structures 640 and 642 are shaped so that an intermediate portion 640c and 642c of the contact structures 640 and 642, respectively, make contact (as indicated by the arrows labelled "C") to another component (not shown).

Generally, by alternating the orientation of the contact structures 640 (pointing in towards the interior of the die surface) and 642 (pointing out towards the exterior of the die), the effective pitch of the contact structures can be larger than the pin-out pitch of the die. (Compare FIG. 5A). Vis-a-vis the interior-pointing contact structures 640, there is a gap between their tips 640b and the surface of the die, in a manner akin to the embodiment shown and described with respect to FIGS. 8A–8C of the PARENT CASE, which allows for deflection of the resilient contact structure without its tip contacting the surface of the semiconductor die. Vis-a-vis the exteriorpointing contact structures 642, their tips 642b are off the edge of the die 612, presenting no such apparent problem (i.e., the tip of the contact structure touching the surface of the die, in response to contact forces).

Throughout FIGS. 6A–6C, the die 612 is shown with a passivation layer 614 on its top (as viewed) surface, in the manner described hereinabove.

Figure 6D:
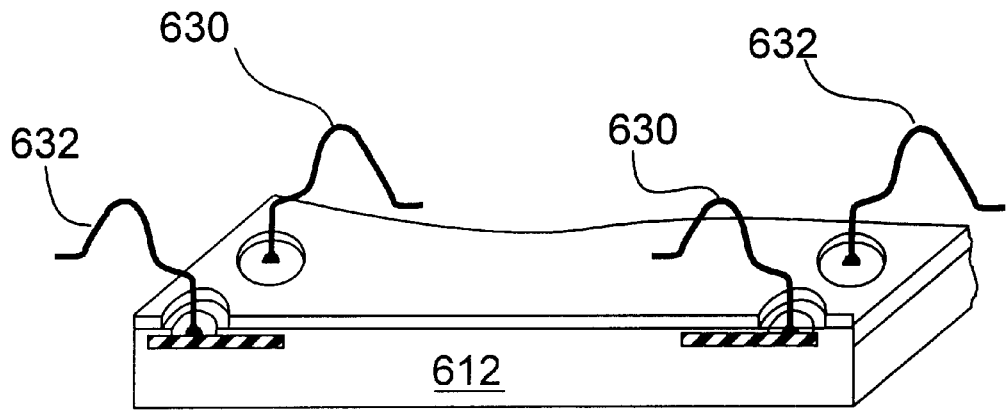
FIG. 6D is a perspective view of an alternate (to FIGS. 6A–6C) process for forming resilient contact structures on dies (either on a wafer or diced therefrom), according to the present invention.

FIG. 6D illustrates an alternate sequence of events, wherein the sacrificial structure 602 is removed prior to overcoating the wire stems 630 and 632. The first step, described with respect to FIG. 6A would remain the same, and a resulting structure would be as illustrated in FIG. 6C.

The technique described hereinabove with respect to FIGS. 6A–6C can be performed at wafer-level, simply by providing a thinner sacrificial structure (602) which simply sits atop the wafer (rather than extending below the side edges of individual dies, as illustrated in FIGS. 6A–6C).

It is within the scope of this invention that the electronic component (612) is "freed" from the sacrificial structure (602) simply by cutting the contact structures (e.g., of FIG. 6B) or the wire stems (e.g., of FIG. 6D).

A general advantage of using a sacrificial structure (e.g., 602) is that no electronic flame-off is required, which otherwise would subject the electronic component (612) to extremely high and potentially-damaging voltages (e.g., 2000 volts).

It is also within the scope of this invention that the contact structures (or wire stems) can stabilized, such as with a hard wax material (or with a suitable casting material, such as thermally-meltable, solution-soluble polymer), and subjected to grinding (polishing) in a plane parallel to the plane of the electronic component, which will result in the contact portion (e.g., 642c) becoming the free end of the contact structure (e.g., by polishing completely through the contact structure or wire stem). This is described hereinbelow, for example, with respect to FIG. 8C.

When using any of the "mechanical" severing techniques described herein, not only are problems associated with the high voltage of spark-severing avoided, but the height of the resulting contact structures is assured, in a direct, physical, straightforward manner.

Using Contacts Mounted on Semiconductor Devices both for Exercising and Packaging the Devices An important feature of the present invention is that by mounting resilient contact structures (composite interconnection elements) directly to bond pads on semiconductor dies, prior to their being singulated (separated) from a wafer, the same resilient contact structures can be used to exercise (test and/or burn-in) the semiconductor devices and to package the semiconductor devices (after they have been singulated).

Figure 7A:
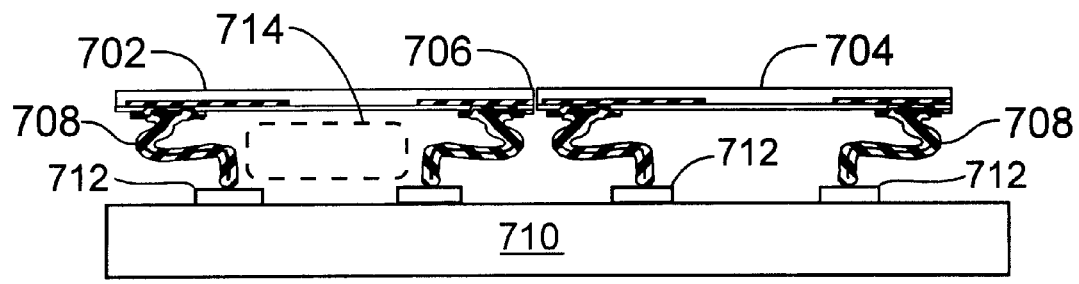
FIG. 7A is a cross-sectional view of unsingulated semiconductor dies with resilient contact structures mounted directly thereto, undergoing testing and/or burn in, according to the invention.

FIG. 7A illustrates a plurality (two of many shown) of semiconductor devices (dies) 702 and 704 prior to singulating the devices from a semiconductor wafer. A boundary between the two devices is indicated by the notch 706. (The notch may or may not actually exist, and represents the position of a kerf (line) where the wafer will be sawed to singulate the devices.)

A plurality (two of many shown, on each device 702 and 704, respectively) of resilient contact structures 708 (compare 430) are directly mounted to the devices 702 and 704, respectively, in the manner described hereinabove, for example, with respect to FIGS. 3A–3C and 4A–4G.

A test board 710 having a plurality (four of many shown) of contact pads (terminals) 712 is brought to bear against the wafer, or vice-versa, so that each of the contact pads effects a pressure connection with a corresponding one of the resilient contact structures. In this manner, a technique is provided for performing "socketless" test and burn-in of unsingulated semiconductor devices.

The test card 710 can be as straightforward (e.g., readily and inexpensively manufactured) printed circuit board (PCB) having a plurality of pads 712 disposed on its top (as viewed) surface.

The wafer (devices 702, 704 and additional devices) are aligned with the card 710, using any suitable alignment means (such as locating pins, not shown) so that each resilient contact structure 708 bears upon a corresponding pad 712. This effects a resilient, "temporary" connection between the card 710 and the electronic components 702 and 704. The card 710 may be provided with edge connectors or the like (not shown) and optionally with built-in test circuitry (not shown), so that test and burn-in of the component is readily performed.

Among the advantages of this technique are that a "special" probe card having its own resilient probe elements is not required, and need not be constructed in order to perform these testing (and burn-in) operations.

An important advantage accruing to the technique illustrated in FIG. 7A is that the resilient contact structures 708 each stand on their own (disassociated from one another), and can be fabricated to extend to a significant distance from the surface of the die (702, 704). This is important, in that it provides an appreciable "dead space" both between the resilient contact structures and between the opposing surfaces of the die (e.g., 702) and the test card 710. This dead space 714 is exemplified by and is illustrated in dashed lines between the opposing surfaces of the die 702 and the test card 710. In many semiconductor applications, it is beneficial to provide decoupling capacitors as close to interconnections as possible. According to the present invention, there is ample space for decoupling capacitors (not shown) to be located in the otherwise "dead space" 714. Such decoupling capacitors can be mounted to either the semiconductor die (702) or to the test card.

Figure 7B:
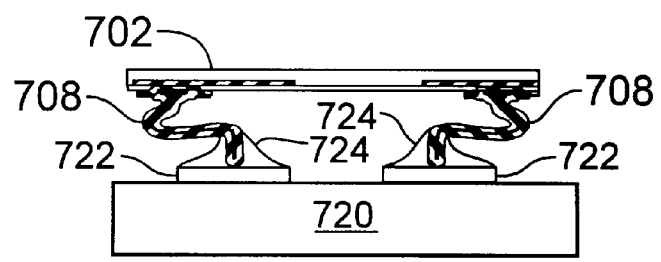
FIG. 7B is a cross-sectional view of a singulated semiconductor die of FIG. 7A effecting an interconnection with a wiring substrate, using the same resilient contact structures mounted directly thereto, according to the invention.

FIG. 7B illustrates that the same resilient contact structures 708 that were used for socketless test and burn-in of the unsingulated semiconductor devices (e.g., 702) can subsequently advantageously be employed, without modification, to effect a "permanent" connection between the electronic component 702 and an interconnection substrate (system board) 720, or the like. The substrate 720 is provided with a plurality of contact pads 722 aligned, on a one-for-one basis, with the tips of the resilient contact structures 708 on the component 702. A permanent connection between component 702 and the substrate 720 can be accomplished (i) by applying "permanent" pressure to the component 702, via spring clips and the like (not shown), to bias the component against the substrate, or (ii) by soldering the component 702 to the substrate 720.

As shown, the resilient contact structures 708 are soldered to the pads 722 on the substrate 720. This is readily accomplished by preparing each pad with a quantity of solder (e.g., solder paste), urging the component 302 against the substrate, and running the assembly through a furnace, for reflowing (thermally cycling) the solder. The reflowed solder is illustrated in FIG. 7B as solder fillets 724.

In a manner similar to that shown with respect to FIG. 7B, there is an appreciable dead space (714) between the resilient contact structures and between the opposing surfaces of the die 702 and the wiring substrate 720 whereat decoupling capacitors and the like can be disposed.

The inventive technique of using the same resilient contact structures (728) for making both temporary and permanent connections to an electronic component is especially beneficial in the context of resilient contact structures mounted to active semiconductor devices (i.e., bare, unpackaged dies).

Another benefit of the inventive technique shown and described with respect to FIGS. 7A and 7B is that for both the test card (710) and the wiring substrate (720), the layout of terminals (712, 722) is essentially the same, "mirroring" the layout of the bond pads (i.e., the resilient contact structures 708) on the semiconductor die. (Vis-a-vis the test card 710, this "sameness" applies on a per-die basis, and is replicated when the test card is sized to exercise multiple unsingulated dies.) In practical terms, this means that the same general "design" (terminal layout) can be applied to both the test card and the wiring substrate, thereby obviating the need to have one design for a probe card and another design for the wiring substrate.

It is within the scope of this invention that tip structures, such as the tip structures 820 described hereinbelow, can be mounted to the tips of the resilient contact structures 708, including prior to excising the unsingulated semiconductor dies 702 and 704.

Packaging Flow

The concept of mounting composite interconnection elements (wire stems having at least one layer of a conductive, metallic coating) to semiconductor devices, at wafer-level, and re-using the same interconnection elements for both testing/burn-in (temporary connection) and for final packaging (permanent connection) of the semiconductor devices was first mentioned in the aforementioned commonly-owned U.S. patent application Ser. No. 08/152,812, and was further elaborated upon in the aforementioned commonly-owned U.S. patent application Ser. No. 08/340,144 (including corresponding PCT/US94/13373). For example, as described in the latter:

"it [is] possible to mount contacts on devices in either wafer or singulated form."

"it is possible to make contact to the semiconductor devices in the wafer prior to die cutting [the] wafer."

"the processes . . . can be utilized with semiconductor devices in wafer form as well as with single semiconductor devices."

" . . . capable of being tested at its full functional speed by yieldably urging the tips of the contact structures . . . into compressive engagement with matching contact terminals provided on a test substrate . . . "

" . . . can also be used for burn-in testing of the semiconductor device."

"By use of resilient contact structures carried by semiconductor devices . . . and using the same to make yieldable and disengageable contacts with contact pads carried by test and burn-in substrates, testing and burn-in can readily be accomplished . . . thereby avoiding the need for first level semiconductor packaging."

Figure 7C:
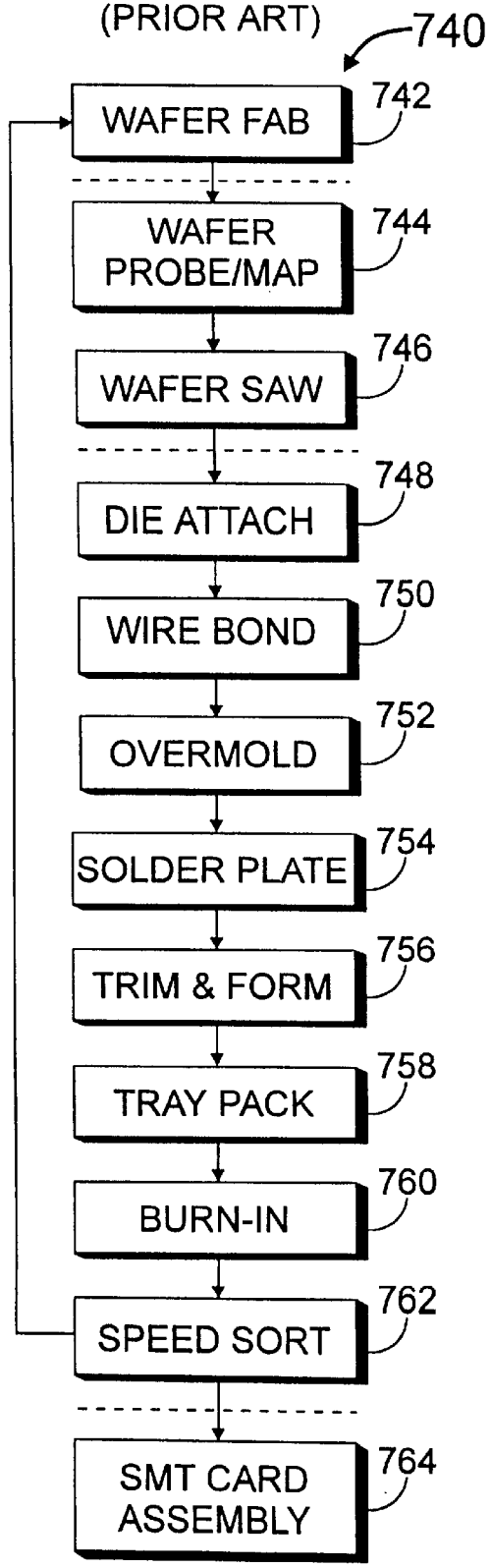
FIG. 7C is a flow chart illustrating an exemplary path that a semiconductor device follows, from wafer to packaging, according to the prior art.

FIG. 7C illustrates an exemplary path 740 that a semiconductor device follows from its fabrication on a semiconductor wafer to final assembly (packaging), according to the prior art. As illustrated by the step 742 ("WAFER FAB"), a plurality of semiconductor devices are fabricated on a semiconductor wafer. Next, in a step 744 ("WAFER PROBE/MAP") the semiconductor devices on the wafer are probed, and a "map" is created to indicate which semiconductor devices have successfully been fabricated, and which semiconductor devices have failed to be successfully fabricated. Next, in a step 746 ("WAFER SAW") the wafer is sawed to singulate the semiconductor devices, and the good dies are set aside for packaging and further testing. The steps 744 and 746, offset by dashed lines, comprise the wafer processing phase of the overall process flow.

Next, the successfully fabricated dies are packaged, such as by attaching ("DIE ATTACH"; step 748) the dies to a paddle of a leadframe, wirebonding ("WIRE BOND"; step 750) bond pads on the dies to leadframe fingers, overmolding ("OVERMOLD"; step 752) the die and leadframe (e.g., with plastic molding compound), optionally solder plating ("SOLDER PLATE"; step 754) external (to the package body) exposed portions of the leadframe fingers, trimming ("dejunking") excess molding compound ("flash") and forming (e.g., gullwings, J-leads) the external portions of the leadframe fingers ("TRIM & FORM"; step 756), placing the packaged dies in a tray pack ("TRAY PACK"; step 758) which can withstand the relatively high temperatures of a burn-in furnace, performing burn-in ("BURN-IN"; step 760), and further testing ("SPEED SORT"; step 762) the packaged semiconductor devices to sort the devices according to prescribed criteria (e.g., performance specifications, such as operating speed). (At the completion of the step 762, feedback can be provided to the wafer fab 742.) These steps 744 ... 762 are illustrative of a chip packaging phase of the overall process flow. In a final step ("SMT CARD ASSEMBLY"; step 764), the packaged, sorted semiconductor device is mounted (such as by surface mount (SMT) to a wiring substrate (card). The same steps would generally apply to semiconductor devices packaged without leadframes (e.g., ball grid array packages).

The process of burning-in a semiconductor device involves powering up the device at an elevated temperature. Evidently, the materials of the package (e.g., plastic) impose constraints upon the temperatures to which the packaged semiconductor device can be exposed in a burn-in furnace. A common burn-in regime involves heating the packaged semiconductor device to a temperature of 125° C. for a period of 168 hours. As discussed hereinbelow, a benefit of the present invention is that semiconductor devices can be burned in at temperatures greater than 125° C., such as at 150° C. and equivalent results will accrue in a much shorter amount of time, such as in 3 minutes (versus 168 hours).

Certain concerns arise when performing burn-in on already-packaged semiconductor devices. Very few packages can tolerate prolonged exposure to high temperatures, especially when non-metallic or non-ceramic materials are included in the packaging.

Figure 7D:
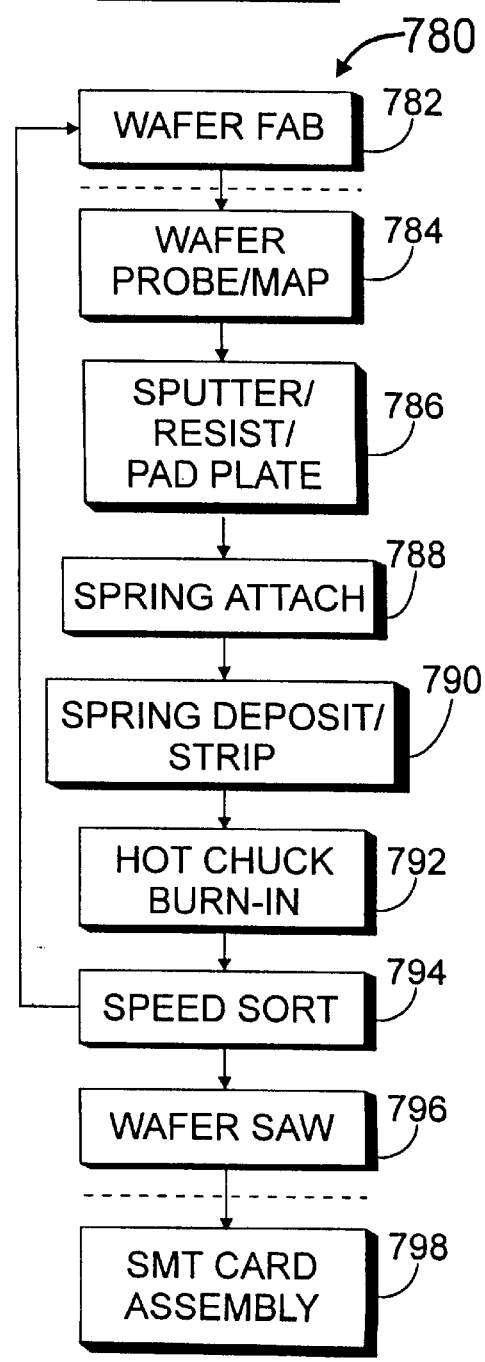
FIG. 7D is a flow chart illustrating an exemplary path that a semiconductor device follows, from wafer to packaging, according to the present invention.

FIG. 7D illustrates an exemplary path 780 that a semiconductor device follows from its fabrication on a semiconductor wafer to final assembly (packaging), according to the present invention. As illustrated by the step 782 ("WAFER FAB"; compare 742), a plurality of semiconductor devices are fabricated on a semiconductor wafer.

In a next step 784 ("WAFER PROBE/MAP"; compare 744) the semiconductor devices on the wafer may be probed, and a "map" created to identify which semiconductor devices have successfully been fabricated, and which semiconductor devices have failed to be successfully fabricated. (As discussed hereinbelow, this step 784 could be omitted, or performed later in the process flow.)

In a next step 786 ("SPUTTER/RESIST/PAD PLATE"), the wafer is processed, for example by sputtering a blanket conductive layer, applying and patterning a masking material such as photoresist, performing pad (terminal) plating, and the like, as described hereinabove, in preparation for mounting resilient contacts thereto (see FIGS. 3A–3C). Optionally, the step 784 could be performed after the step 786.

In a next step 788 ("SPRING ATTACH"), the aforementioned core portions (compare 112, 122, 132, 142, 152, 216, 320; also referred to as "wire stems") of the resilient contact structures (composite interconnection elements) are attached to the pads (terminals). This may be done on only those dies that have passed the initial wafer probing (step 784). Alternatively, even those dies that failed in initial wafer probing (step 784) can have core portions attached thereto, to uniformize subsequent overcoating (step 790, described hereinafter).

In a next step 790 ("SPRING DEPOSIT/STRIP"), the overcoat material is applied over the cores, and the masking material (photoresist) and portions of the blanket conductive layer underlying the masking material are removed (see FIGS. 3A–3C). Optionally, the step 784 could be performed after the step 786.

Next, in a step 792 ("HOT CHUCK BURN-IN"), the unpackaged semiconductor devices are burned-in. Power is provided to the unsingulated semiconductor devices by making pressure connections to the resilient contact structures (composite interconnection elements) mounted to the unsingulated semiconductor devices.

Preferably, the burn-in step 792 is performed at a temperature of at least 150° C. Since the semiconductor device is not yet packaged, and since the composite interconnection elements mounted to the semiconductor devices are entirely metallic, at this stage of the process, it is possible to subject the semiconductor device to temperatures that would otherwise be destructive of packaged semiconductor devices (compare step 760) which include materials which cannot sustain such elevated temperatures. Burn-in can be performed upon all of the wafer-resident (un-singulated) semiconductor devices, or upon selected portions of the wafer-resident semiconductor devices.

According to an aspect of the invention, unpackaged semiconductor devices can be burned in at temperatures greater than 125° C., such as at least 150° C. (including at least 175° C. and at least 200° C.) and satisfactory results will be obtained in a matter of several (e.g., 3) minutes, rather than several (e.g., 168) hours. Evidently, the quicker that burn-in can be performed, the shorter the overall process time will be and commensurate cost savings will accrue. The use of higher burn-in temperatures is facilitated by the fact that the composite interconnection elements of the present invention are metallic structures. According to this feature of the invention, satisfactory burn-in can be performed in less than 60 minutes, including less than 30 minutes and less than 10 minutes.

Next, in a step 794 ("SPEED SORT"; compare 762), the unpackaged semiconductor devices are tested to sort the devices according to prescribed criteria (e.g., performance specifications). This can be performed on one unsingulated die at a time (testing a plurality of unsingulated dies in sequence), or can be performed on more than one die at a time. At the completion of this step, feedback can be provided (e.g., yield problems reported) to the wafer fab 782. If high yield is observed in this step 796, it may be desired to omit the probing step 784 entirely.

Next, in a step 796 ("WAFER SAW"; compare 746), the semiconductor devices are singulated (separated) from the wafer.

These steps 784 . . . 796 are illustrative of a chip packaging phase of the overall process flow (methodology) of the present invention.

In a final step 798 ("SMT CARD ASSEMBLY"; compare step 764), the unpackaged, sorted semiconductor device is finally assembled, such as by surface mount (SMT) to a wiring substrate (card).

Pre-fabricating Tip Structures, Processing Composite Interconnection Elements, and Joining the Tip Structures to the Interconnection Elements FIGS. 2D–2F, discussed hereinabove, disclose a technique for fabricating tip structures (258) on a sacrificial substrate (254), and fabricating composite interconnection elements 264 on the tip structures (258) for subsequent mounting to terminals of an electronic component.

Figure 8A:
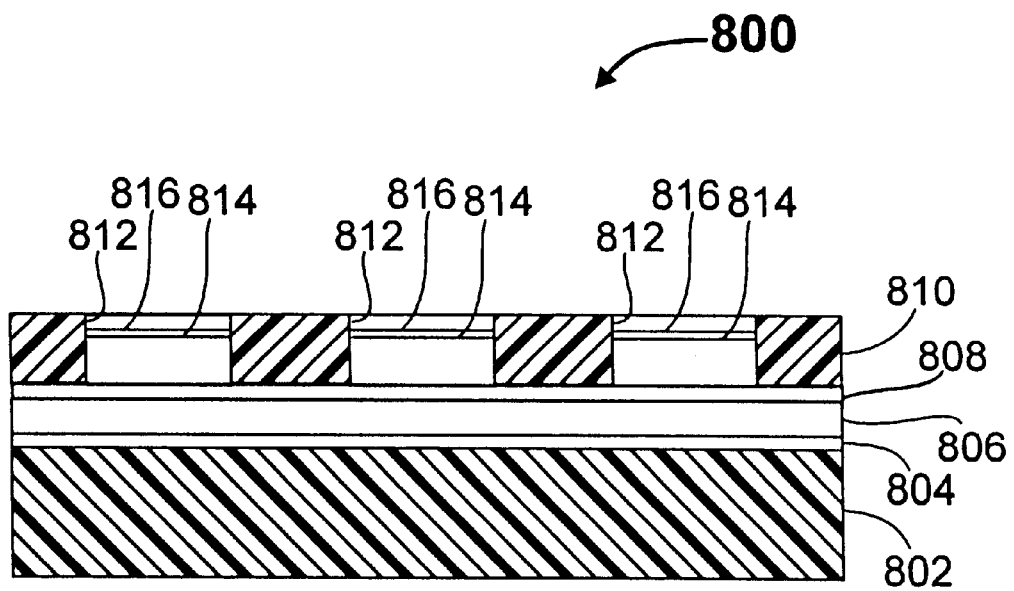
FIG. 8A is a cross-sectional view of a technique for fabricating tip structures for probe elements, according to the invention.

FIG. 8A illustrates an alternate technique 800 for fabricating composite interconnection elements having pre-fabricated tip structures brazed (e.g.) thereto, and is particularly useful in the context of resilient contact structures residing on semiconductor devices.

In this example, a silicon substrate (wafer) 802 having a top (as viewed) surface is used as the sacrificial substrate. A layer 804 of titanium is deposited (e.g., by sputtering) onto the top surface of the silicon substrate 802, and has a thickness of approximately 250 Å (1Å=0.1 nm=$10^{-10}$ m). A layer 806 of aluminum is deposited (e.g., by sputtering) atop the titanium layer 804, and has a thickness of approximately 10,000 Å. The titanium layer 804 is optional and serves as an adhesion layer for the aluminum layer 806. A layer 808 of copper is deposited (e.g., by sputtering) atop the aluminum layer 806, and has a thickness of approximately 5,000 Å. A layer 810 of masking material (e.g., photoresist) is deposited atop the copper layer 808, and has a thickness of approximately 2 mils. The masking layer 810 is processed in any suitable manner to have a plurality (three of many shown) of holes 812 extending through the photoresist layer 810 to the underlying copper layer 808. For example, each hole 812 may be 6 mils in diameter, and the holes 812 may be arranged at a pitch (center-to-center) of 10 mils. The sacrificial substrate 802 has, in this manner, been prepared for fabricating a plurality of multilayer contact tips within the holes 812, as follows:

A layer 814 of nickel is deposited, such as by plating, onto the copper layer 808, and has a thickness of approximately 1.0–1.5 mils. Optionally, a thin layer (not shown) of a noble metal such as rhodium can be deposited onto the copper layer prior to depositing the nickel. Next, a layer 816 of gold is deposited, such as by plating, onto the nickel 814. The multi-layer structure of nickel and aluminum (and, optionally, rhodium) will serve as a fabricated tip structure (820, as shown in FIG. 8B).

Figure 8B:
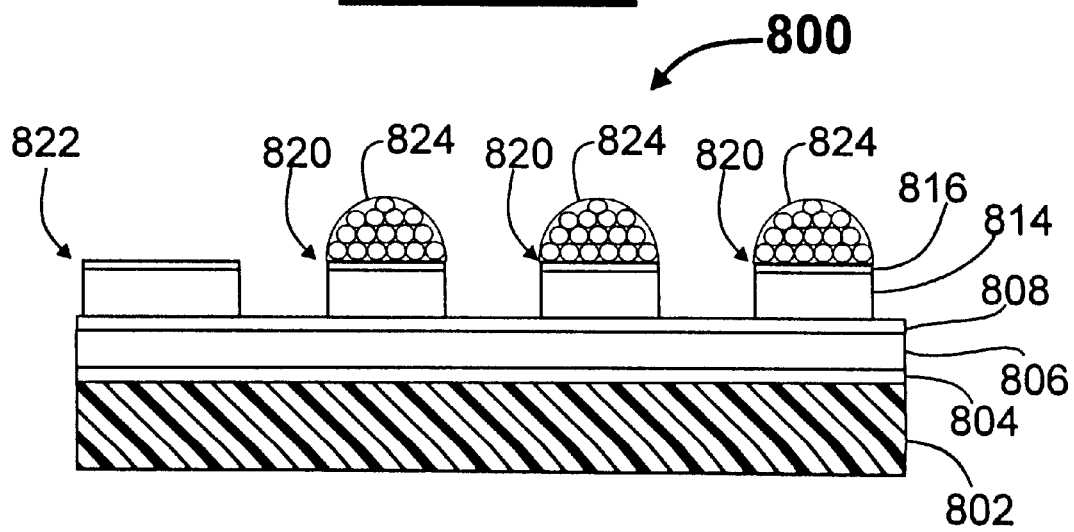
FIG. 8B is a cross-sectional view of further steps in the technique of FIG. 8A, according to the invention.

Next, as illustrated in FIG. 8B, the photoresist 810 is stripped away (using any suitable solvent), leaving a plurality of fabricated tip structures 820 sitting atop the copper layer 808. Next, the copper (808) is subjected to a quick etch process, thereby exposing the aluminum layer 806. As will be evident, aluminum is useful in subsequent steps since it is substantially non-wettable with respect to solder and braze materials.

It bears mention that it is preferred to pattern the photoresist with additional holes within which "ersatz" tip structures 822 may be fabricated in the same process steps employed to fabricate the tip structures 820. These ersatz tip structures 822 will serve to uniformize the aforementioned plating steps in a manner that is well known and understood, by reducing abrupt gradients (non-uniformities) from manifesting themselves across the surface being plated. Such structures (822) are known in the field of plating as "robbers".

Next, solder or brazing paste ("joining material") 824 is deposited onto the top (as viewed) surfaces of the tip structures 820. (There is no need to deposit the paste onto the tops of the ersatz tip structures 822). This is implemented in any suitable manner, such as with a stainless steel screen or stencil. A typical paste (joining material) 824 would contain gold-tin alloy (in a flux matrix) exhibiting, for example, 1 mil spheres (balls).

The tip structures 820 are now ready to be mounted (e.g., brazed) to ends (tips) of resilient contact structures, preferably the composite interconnect elements of the present invention. However, it is preferred that the composite interconnect elements first be specially "prepared" to receive the tip structures 820.

Figure 8C:
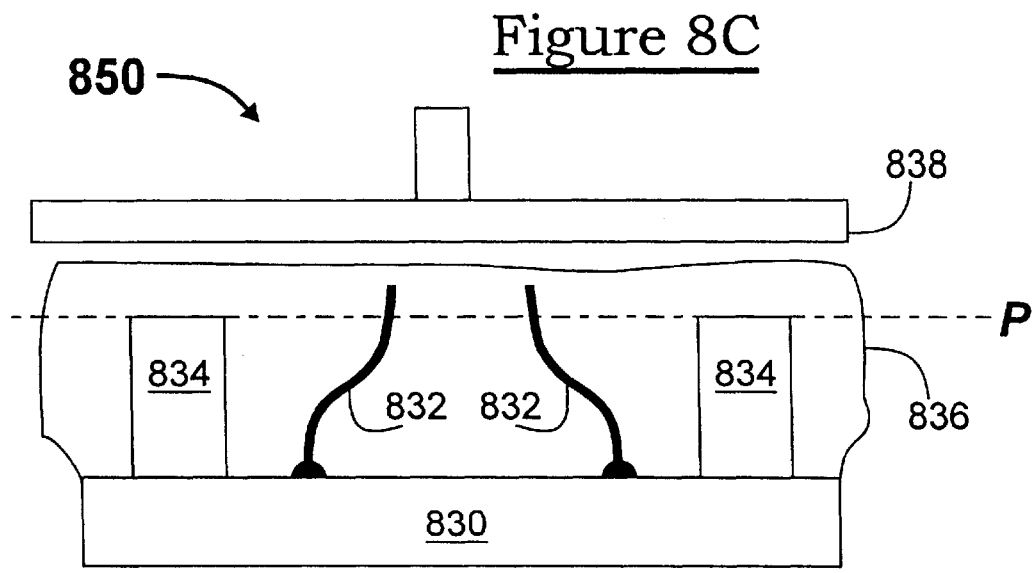
FIG. 8C is a side view, partially in cross-section and partially in full of a space transformer component, according to the invention.

FIG. 8C illustrates a technique 850 for preparing one 830 of a plurality of unsingulated semiconductor devices with a plurality (two of many shown) of composite interconnection elements 832 (compare 324) in anticipation of tip structures (820) being mounted to the ends of the composite interconnection elements 832. The composite interconnections elements 832 are shown in full (rather than in cross section).

In this example, the composite interconnection elements 832 are multilayer (compare FIG. 2A) and have a gold (wire) core overcoated with a layer (not shown) of copper and further overcoated with a layer (not shown) of nickel (preferably a nickel-cobalt alloy having proportions 90:10 of Ni:Co), and further overcoated with a layer (not shown) of copper. As will be evident, it is preferred that the nickel layer be deposited to only a substantial portion (e.g., 80%) of its desired final thickness, the remaining small portion (e.g., 20%) of the nickel thickness being deposited in a subsequent step, described hereinbelow.

In this example, the semiconductor die 830 is provided with a plurality (two of many shown) of pillar-like structures 834 extending from its top (as viewed) surface which, as will be evident, will function as polishing "stops". It is not necessary to have a large number of these polishing stops.

The semiconductor device(s) 830 are then "cast" with a suitable casting material 836, such as thermally-meltable, solution-soluble polymer, which serves to support the composite interconnection elements 832 extending from the top surface of the semiconductor device(s). The top (as viewed) surface of the overmolded semiconductor device(s) is then subjected to polishing, such as with a polishing wheel 838 which is urged down (as viewed) onto the top surface of the casting material. The aforementioned polishing stops 834 determine the final position of the polishing wheel, as indicated by the dashed line labelled "P". In this manner, the tips (top ends, as viewed) of the composite interconnection elements 832 are polished to be substantially perfectly coplanar with one another.

It is generally advantageous that the tops of the resilient contact structures are coplanar, to ensure that reliable pressure connections are made with either a test card (e.g., 710) or with a wiring substrate (720). Certainly, starting with tips which have been planarized by polishing (or by any other suitable means) will contribute to achieving this important objective.

After having planarized the tips of the resilient contact structures by polishing, the casting material 836 is removed with a suitable solvent. (The polishing stops 834 will be removed at this time.) Casting materials are well known, as are their solvents. It is within the scope of this invention that casting materials such as wax, which can simply be melted away, can be used to support the interconnection elements (832) for polishing. The semiconductor device(s) has (have), in this manner, been prepared to receive the aforementioned tip structures (820).

A beneficial side effect of the polishing operation is that the material overcoating the gold wire stem (core) of the composite interconnection element 832 will be removed at the tip, leaving the gold core exposed. Inasmuch as it is desired to braze tip structures (820) to the tips of the composite interconnection elements, having exposed gold material to braze to is desireable.

That having been said, it is preferred to further "prepare" the composite interconnection elements for receiving the tip structures by first performing one additional plating step—namely, nickel plating the composite interconnection elements 832 to provide the composite interconnection elements with the aforementioned remaining small portion (e.g., 20%) of their desired, overall nickel thickness.

Figure 8D:
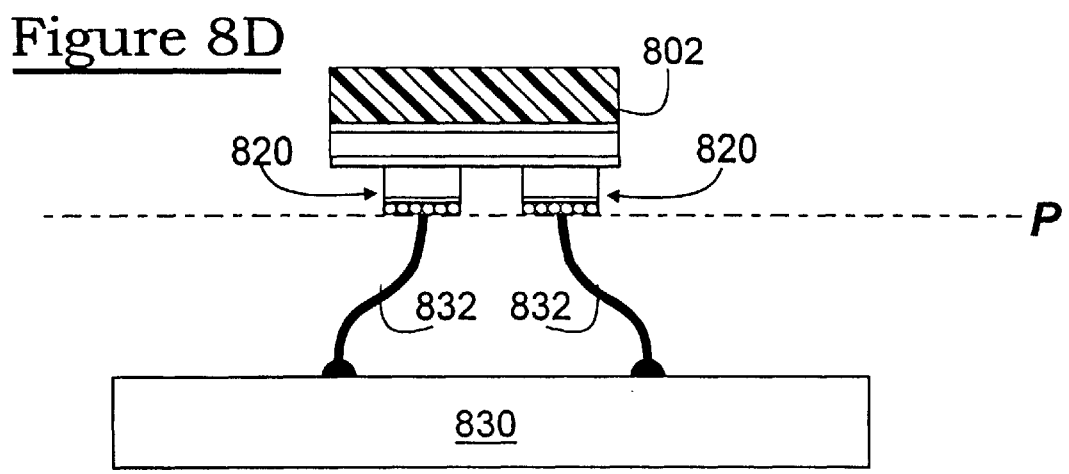
FIG. 8D is a side view, partially in cross-section and partially in full of the space transformer component of FIG. 8C being joined with the tip structures of FIG. 8B, according to the invention.

The prepared substrate shown in FIG. 8B is now brought to bear upon the prepared semiconductor device(s). As shown in FIG. 8D, the tip structures 820 (only two tip structures are shown in the view of FIG. 8D, for illustrative clarity) are aligned with the tips of the composite interconnection elements 832, using standard flip-chip techniques (e.g., split prism), and the assembly is passed through a brazing furnace to reflow the joining material 824, thereby joining (e.g., brazing) the prefabricated tip structures 820 to the ends of the contact structures 832.

It is within the scope of this invention that this technique can be used to join (e.g., braze) pre-fabricated tip structures to ends of non-resilient contact structures, resilient contact structures, composite interconnection elements, and the like.

Figure 8E:
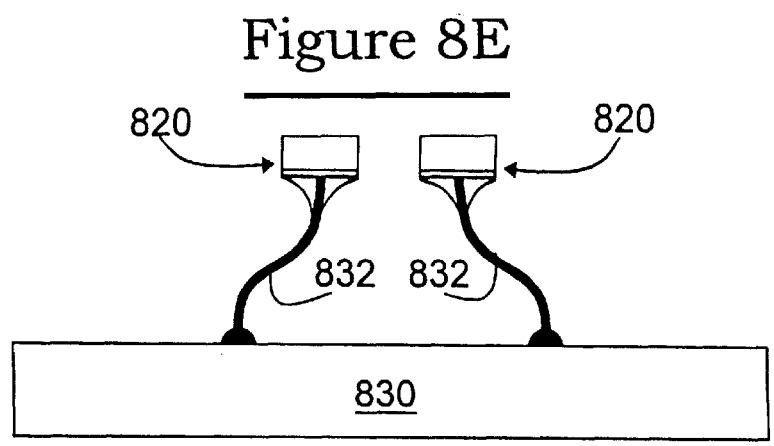
FIG. 8E is a side view, partially in cross-section and partially in full of a further step in joining the space transformer component of FIG. 8C joined with the tip structures of FIG. 8B, according to the invention.

During the reflow process, the exposed aluminum layer (806), being non-wettable, prevents solder (i.e., braze) from flowing between the tip structures 820, i.e., prevents solder bridges from forming between adjacent tip structures. In addition to this anti-wetting function of the aluminum layer, the aluminum layer also serves as a release layer. Using a suitable etchant, the aluminum is preferentially (to the other materials of the assembly) etched away, and the silicon substrate 802 simply "pops" off, resulting in a semiconductor device having composite interconnection elements each having a prefabricated tip structure, as illustrated in FIG. 8E. (Note that the joining material 824 has reflowed as "fillets" on end portions of the interconnection elements 832.) In a final step of the process, the residual copper (808) is etched away, leaving the tip structure 820 with nickel (or rhodium, as discussed hereinabove) exposed for making contact to terminals of another electronic component (e.g., 710 or 720).

It is within the scope of this invention, but it is generally not preferred, that composite interconnection elements (such as 832) can first be fabricated on the tip structures themselves, in the "spirit" of the technique described with respect to FIGS. 2D–2F, utilizing the tip structure metallurgy described with respect to FIG. 8A, and subsequently mounted to the semiconductor device(s).

It is within the scope of the invention that the brazing (soldering) paste 824 is omitted, and in its stead, a layer of eutectic material (e.g., gold-tin) is plated onto the resilient contact structures prior to mounting the contact tips (820) thereto.

Using any of the techniques described hereinabove for forming contact tips at the ends of resilient contact structures is particularly useful in the context of making pressure connections via the intermediary of a z-axis conducting adhesive. The use of such adhesives is becoming common, for example, in mounting active devices to liquid crystal display (LCD) panels.

As described hereinabove, the distal end (tip) of the contact structure can be provided with a topological contact pad, or the like. It is, for example, within the scope of this invention that the tips of the contact structures can be provided with flat tabs (pressure plates). In this manner, interconnections to external components are readily made (without soldering or the like), especially to fragile external components, through the intermediary of what is termed "z-axis conducting adhesive", which is a known material having conductive (e.g., gold) particles disposed therein and which becomes conductive under compression.

Figure 8F:
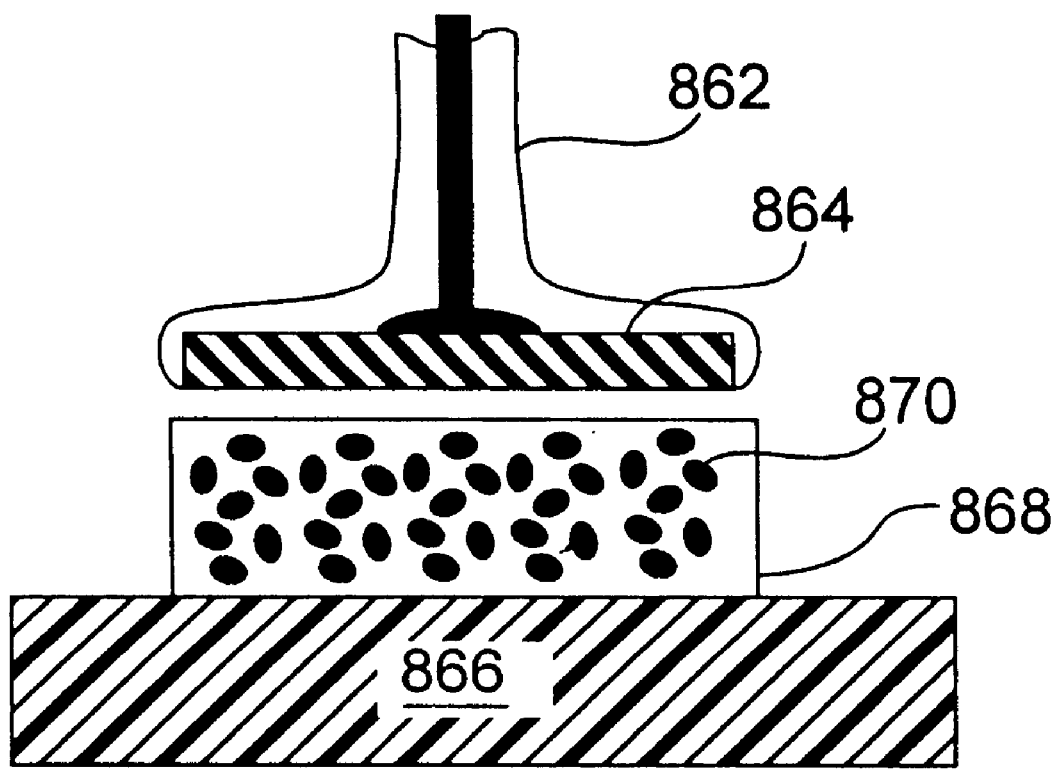
FIG. 8F is a side view, showing a portion of a contact structure interconnecting to an external component, according to the present invention.

FIG. 8F illustrates an overcoated wire stem 862, the distal end (tip) of which is provided with a flat tab (pad) 864, in a manner similar to the technique described hereinabove with respect to FIGS. 2E or 8A–8B.

An electrical interconnection is effected from the contact structure 862 to an external electronic component 866 by means of a z-axis conducting adhesive 868 having conductive particles 870 suspended throughout. When the electronic component (omitted in this view) to which the contact structure 862 is urged (see arrow "C") against the external component 866, the adhesive 868 is compressed and becomes conductive.

Contacting a Central Portion of the Interconnection Element

According to an aspect of the invention, electrical contact between a contact structure mounted to a first electronic component can be made by a central portion of the wire stem which has been overcoated, rather than with the overcoat material.

Figure 9A:
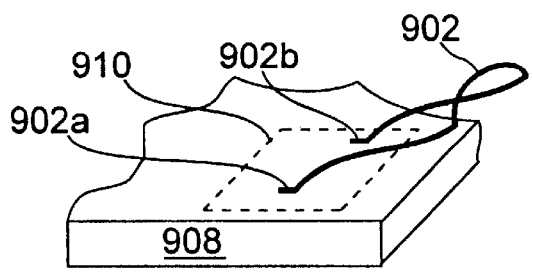
FIGS. 9A–9D are perspective views of a technique for fabricating a resilient contact structure suitable for making interconnection to an exposed, middle portion of the wire stem, according to the present invention.

FIG. 9A illustrates a wire stem 902 having a one end 902*a* bonded to a substrate 908 (e.g., a semiconductor device) and another end 902*b* bonded to the substrate 908. The ends 902*a* and 902*b* are both bonded to the same contact area 910 (e.g., bond pad) on the substrate 908.

Figure 9B:
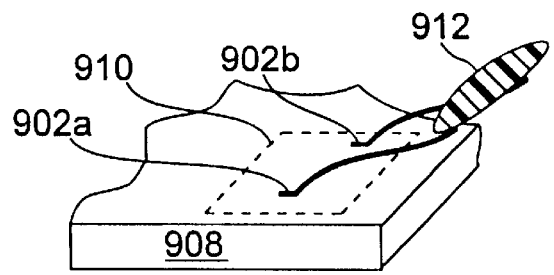

FIG. 9B illustrates a next step, wherein a middle section of the wire stem is masked, such as with photoresist 912, to prevent subsequent overcoating (e.g., plating) of the masked portion of the wire stem.

Figure 9C:
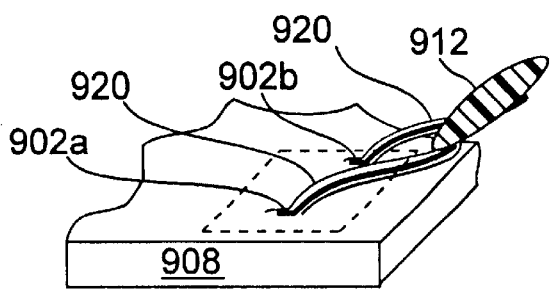

FIG. 9C illustrates a next step, wherein the masked wire stem is overcoated with at least one layer of a material 920, such as nickel.

Figure 9D:
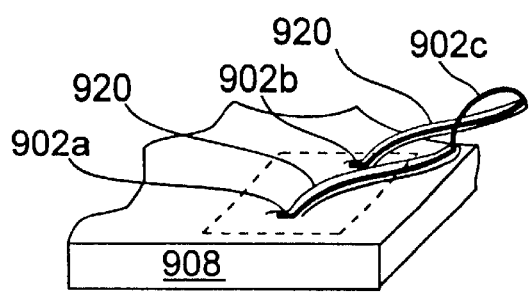

FIG. 9D illustrates a next step, wherein the masking material 912 is removed. This leaves the central portion 902*c* of the wire stem exposed, for making contact to another electronic component. In this context, gold is a good choice for the wire stem (902), due to its superior electrical contact properties, and it is not important that the overcoat material 920 be electrically conductive (only that it establish the spring qualities of the resulting contact structure).

Multiple Free-standing Wire Stems, Single Severing Step

In many of the embodiments presented hereinabove, it has been described that a wire (e.g., gold wire) can be bonded to a contact area on an electronic component, shaped (including straight), and severed to be free-standing. In this manner, one end of the resulting wire stem is attached to the electronic component, and the other (free) end of the wire stem is available for making contact to another electronic component. Generally, this requires individually forming each freestanding wire stem by repeating the steps of bonding and severing, for each wire stem.

According to an aspect of the invention, a plurality of (multiple) free-standing wire stems may be formed with a plurality of bonding steps and a single severing step.

This embodiment can be understood by referencing the previously-described FIGS. 9A–9D. In this case, however, the ends 902a and 902b of the wire stem 902 may be bonded to the same contact area (910), or to two distinct contact areas (110, 110, not shown) on the substrate 908.

It is useful, in any of the embodiments disclosed herein wherein the core becomes exposed through the overcoat (or, as in the previous example of FIGS. 9A–9D) is not overcoated in a selected area, that a gold wire stem (902) is first overcoated with a thin layer of tin, which will ultimately form a goldtin eutectic, which is particularly useful for subsequent brazing operations.

Figure 9E:
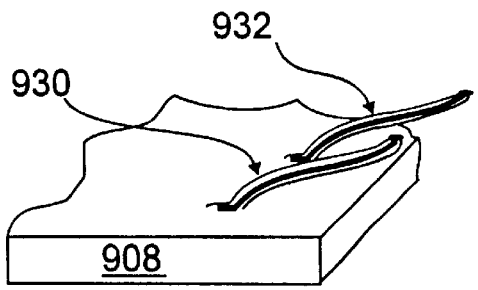
FIG. 9E is a perspective view of a technique for fabricating multiple free-standing contact structures without severing the wire stem, according to the present invention.

In this embodiment, after removing the mask (912), the contact structure is heated to a sufficient temperature which will reflow the eutectic wire stem, and cause the exposed "bridge" (bight) 902c between the two "legs" of the contact structure to "collapse", resulting in two free-standing contact structures 930 and 932, as shown in FIG. 9E, each having eutectic tips (compare FIG. 49B of the PARENT CASE)—the tips (distal ends) being suitable for making contact to another electronic component.

It is within the scope of this invention that this principle could be applied to a sequence of loops, such as are shown in FIG. 24C of the PARENT CASE, to form multiple free-standing contact structures, without requiring severing (e.g., electronic flame off) the free ends of each of the wire stems.

According to an embodiment of the invention, a plurality of single bond wires can be looped between two electronic components, then severed, to form a double-plurality of free-standing wire stems (or overcoated wire stems).

Figure 9F:
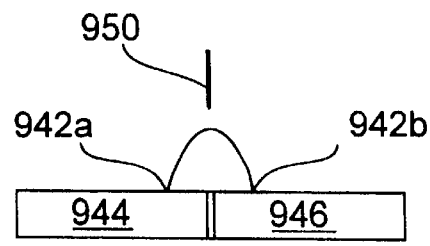
FIG. 9F is a side view of an alternate technique for fabricating multiple free-standing contact structures without severing the wire stem, according to the present invention.

For example, as shown in FIG. 9F, a single wire stem 942 has first end 942a mounted to a first electronic component 944 and a second end 942b mounted to a second electronic component. Attention is directed to FIG. 5 to illustrate the point that the two electronic components 944 and 946 may be adjacent unsingulated semiconductor dies on a semiconductor wafer.

The example of FIG. 9F, where a wire stem (core) bridges two adjacent electronic components (e.g., semiconductor dies) is illustrative of an exception to the "rule" that an interconnection element mounted to an unsingulated semiconductor die should not overhang an edge of the semiconductor die to which it is attached (mounted).

As mentioned hereinabove, it is generally preferred that contact structures mounted to unsingulated semiconductor dies, according to the present invention, do not extend over the edges of the dies—an area between two adjacent dies being a kerf area whereat a saw (or the like) will perform the operation of singulating (dicing) the dies.

As shown in FIG. 9F, the "bridge" portion of the wire stem 942 may simply be sawed in the same operation as singulating the dies, with a kerfing saw 950. Compare FIG. 4F.

The concept of making multiple free-standing contact structures without severing can also be done with simple wirebond loops extending from a one terminal to another terminal, or from a terminal on a one die to a terminal on another die (compare FIG. 5). Additionally, a sequence of loops, can be dealt with in this manner, leaving behind a large number of free-standing wire stems, each mounted to a distinct terminal on the electronic component.

It is also within the scope of this invention that the wire stems shown in FIG. 6B can have their topmost portions removed in any suitable manner, which will separate the frame from the die(s). Rather than (e.g., dissolving the frame, Generally, it is within the scope of this invention that loops may be formed (typically from terminal to terminal), and their bight portions removed in any suitable manner to result in two free-standing wire stems per loop. For example, the loops can be encapsulated in a material such as wax, and polished to separate the legs from one another. This can be done before overcoating, or after overcoating. If done after overcoating, the wire stem will be exposed, and the benefits of having an eutectic wire stem can readily be realized.

Figure 10A:
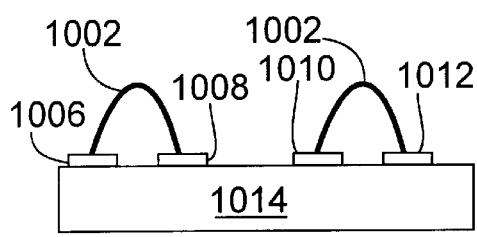
FIGS. 10A and 10B are side views of an alternate technique for multiple free-standing contact structures without severing the wire stem, according to the present invention.
Figure 10B:
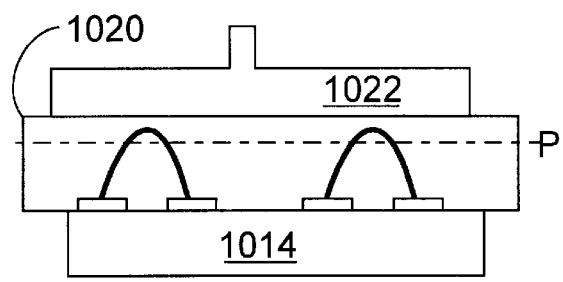

For example, FIG. 10A illustrates a plurality (two of many shown) of loops 1002 and 1004 formed between terminals 1006, 1008, 1010 and 1012 on a surface of an electronic component 1014. FIG. 10B shows the loops 1002 and 1004 encapsulated (e.g., potted) in a sacrificial material 1020 (compare 836), such as hard wax. After being potted in this manner, a grinding (polishing) tool 1022 (compare 838) is brought to bear down upon the potted loops, grinding through the potting material 1020 and through the bight portions of the loops 1002 and 1004, until the loops are severed. (This is indicated by the dashed line labelled "P" in the figure). Then, the potting material is removed (such as by melting). This results in each loop being two, free-standing wire stems (not illustrated). It is within the scope of this invention that the wire stems (loops) are overcoated either before potting, or after grinding (and removing the potting material). If the wire stems are overcoated prior to potting, the wire stems would be exposed to form braze-able tips.

It is within the scope of this invention that the loop wire stems (e.g., 1002) extend from a terminal on a one electronic component to a terminal on another electronic component (rather than the two terminals being on the same electronic component, as illustrated).

By fabricating multiple wire stems from loops, or the like, electronic components (such as semiconductor devices) to which the loops (and, ultimately the free-standing contact structures) are mounted are spared from the high, potentially damaging, voltages (e.g., thousands of volts in a discharge) associated with electronic flame off techniques.

Figure 10C:
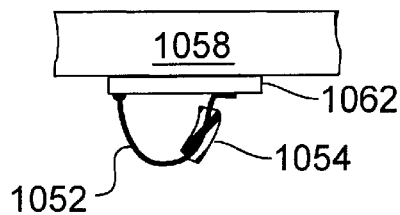
FIGS. 10C and 10D are side views, illustrating a technique for making free-standing wire stems, without electronic flame off, in this case, from loops, according to the present invention.
Figure 10D:
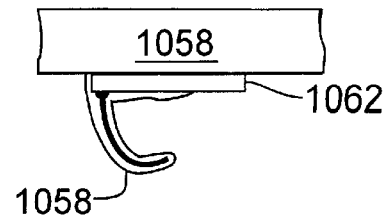

FIGS. 10C and 10D illustrate another technique for making free-standing wire stems, without electronic flame off, from loops, according to the present invention. As illustrated, a wire stem 1052 extending from a terminal 1062 on an electronic component 1058 is formed into a loop and bonded back onto the terminal (or onto another terminal on the electronic component, or onto another terminal on another electronic component). A substantial portion of one "branch" (leg) of the loop is covered with a masking material 1054, such as photoresist. The loop is then overcoated with a material 1058, and the photoresist is removed, at which point the previously-masked branch of the loop can also be removed, resulting in a free-standing overcoated wire stem, as illustrated in FIG. 10D.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein. Several of these variations are set forth in the parent case.

For example, in any of the embodiments described or suggested herein where a masking material (e.g., photoresist) is applied to a substrate and patterned such as by exposure to light passing through a mask and chemically removing portions of the masking material (i.e., conventional photolithographic techniques), alternate techniques can be employed, including directing a suitable collimated light beam (e.g., from an excimer laser) at portions of the masking material (e.g., blanket hardened photoresist) sought to be removed, thereby ablating these portions of the masking material, or directly (without the use of a mask) hardening portions of the masking material with a suitable collimated light beam then chemically washing off the non-hardened masking material.

For example, in an automated process, multiple unsingulated semiconductor dies can be exercised (tested and/or burned-in) while resident on a semiconductor wafer, and determinations can be made of which dies are "good", which pairs (or other multiples) of dies are "good", and bins arranged (in the automated processing line) to sort these different categories of dies upon their singulation from the wafer.

As mentioned hereinabove, the composite interconnection elements of the present invention are but an example of suitable resilient contact structures that can be mounted directly to terminals of a semiconductor device. Instrumentalities such as are disclosed in the aforementioned U.S. Pat. No. 5,414,298 fail in this regard.

The inventive technique of overcoating a generally non-resilient (albeit easily shaped) core (wire, ribbon, etc.) and overcoating with a springable (e.g., relatively high yield strength) material is distinctive in that the overcoat serves a dual purpose: (1) it, for the most part, determines the physical properties of the resulting contact structure (composite interconnection element), and (2) it securely anchors the composite interconnection element to the terminal of the electronic component.

Moreover, as mentioned hereinabove, there is ample space (714) available between the resilient contact structures (728) to accommodate any desired additional electronic component(s), such as decoupling capacitor(s).

What is claimed is:

1. Method of temporarily connecting to a semiconductor device prior to permanently connecting to the semiconductor device, comprising:

permanently mounting a plurality of elongate free-standing electrical contact structures to a bare semiconductor device;

urging the semiconductor device against a first electronic component to effect a temporary connection between the semiconductor device and the first electronic component, with the electrical contact structures serving as an electrical interconnect between the semiconductor device and the first electronic component; and using the same electrical contact structures mounted to the semiconductor device to effect a permanent connection between the semiconductor device and a second electronic component.

2. Method, according to claim 1, further comprising:

effecting the permanent connection by mechanically biasing the semiconductor device against the second electronic component.

3. Method, according to claim 1, further comprising:

the semiconductor device to the second electronic component by brazing or soldering.

4. Method, according to claim 1, wherein:

the electrical contact structures are resilient.

5. Method, according to claim 1, wherein:

the electrical contact structures are compliant.

6. Method, according to claim 1, further comprising:

performing a process selected from the group consisting of test and burn-in on the semiconductor device while it is urged against the first electronic component.

7. Method, according to claim 1, further comprising:

joining contact tip structures to ends of the elongate free-standing electrical contact structures.

8. Method, according to claim 7, wherein:

the contact tip structures are pre-fabricated on a sacrificial substrate; and further comprising removing the sacrificial substrate after joining the contact tip structures to the elongate free-standing contact structures.

9. Method, according to claim 8, wherein:

the contact tip-structures comprise at least one layer of a conductive material.

10. Method, according to claim 8, wherein:

the sacrificial substrate is a silicon wafer.

11. Methods, according to claim 1, wherein:

the elongate electrical contact structures are hermetically sealed to the bare semiconductor device.

12. Method, according to claim 1, wherein the elongate free-standing electrical contact structures are formed by:

providing an insulating layer over a patterned metal layer on a surface of the at least one semiconductor die;

providing a plurality of openings in the insulating layer;

providing a blanket conductive layer atop the insulating layer;

providing a patterned layer of masking material over the blanket conductive layer, said patterned layer of masking material having a plurality of openings aligned with the plurality of openings in the insulating layer;

bonding a wire to the blanket conductive layer within each of at least a portion of the openings in the patterned layer of masking material;

causing each bonded wire to extend from the surface of the semiconductor die;

severing each bonded wire at a distance from the surface of the semiconductor die; and overcoating each severed wire and exposed portions of the blanket conductive layer.

13. Method, according to claim 12, further comprising:

after overcoating the severed wires, removing the masking material and selectively removing all but the previously exposed portions of the blanket conductive layer.

14. Method, according to claim 12, wherein:

the masking material is photoresist.

15. Method, according to claim 12, wherein:

the openings in the patterned layer of masking material are larger than the openings in the insulating layer.

* * * * *